United States Patent
Satou et al.

(10) Patent No.: US 9,074,825 B2
(45) Date of Patent: Jul. 7, 2015

(54) HEATSINK APPARATUS AND ELECTRONIC DEVICE HAVING THE SAME

(75) Inventors: Kaoru Satou, Kumamoto (JP); Haruhiko Kouno, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1263 days.

(21) Appl. No.: 12/239,186

(22) Filed: Sep. 26, 2008

(65) Prior Publication Data

US 2009/0084525 A1    Apr. 2, 2009

(30) Foreign Application Priority Data

Sep. 28, 2007  (JP) ................................. 2007-254040
Sep. 28, 2007  (JP) ................................. 2007-254044

(51) Int. Cl.
*F28D 15/02*  (2006.01)
*G06F 1/20*  (2006.01)
*H01L 23/427*  (2006.01)

(52) U.S. Cl.
CPC .............. *F28D 15/0266* (2013.01); *G06F 1/20* (2013.01); *H01L 23/427* (2013.01); *H01L 2924/0002* (2013.01)

(58) Field of Classification Search
CPC . H01L 23/473; H01L 23/427; F28D 15/0266; G06F 1/20
USPC .................................................. 165/908, 80.4
See application file for complete search history.

(56) References Cited

U.S. PATENT DOCUMENTS

| | | | | |
|---|---|---|---|---|
| 4,838,041 A | * | 6/1989 | Bellows et al. | 62/51.2 |
| 5,070,936 A | * | 12/1991 | Carroll et al. | 165/80.4 |
| 5,757,615 A | | 5/1998 | Donahoe et al. | |
| 5,940,270 A | * | 8/1999 | Puckett | 361/699 |
| 6,321,831 B1 | | 11/2001 | Tanaka et al. | |
| 6,333,849 B1 | | 12/2001 | Donahoe et al. | |

(Continued)

FOREIGN PATENT DOCUMENTS

| JP | 59-142384 | 8/1984 |
|---|---|---|
| JP | 60-136349 | 7/1985 |

(Continued)

OTHER PUBLICATIONS

English language Abstract of JP 10-213370 A, Aug. 11, 1998.

(Continued)

*Primary Examiner* — Marc Norman
*Assistant Examiner* — Jon T Schermerhorn
(74) *Attorney, Agent, or Firm* — Greenblum & Berstein, P.L.C.

(57) ABSTRACT

A heatsink apparatus performs cooling by circulating a working fluid and causing a phase change between a liquid phase and a gas phase. The heatsink apparatus is provided on an external wall with a heat-generating body. The heatsink apparatus includes a box-shaped heat-receiving unit transferring heat to a heat-receiving plate; an inlet pipe supplying the working fluid to the heat-receiving unit; an outlet pipe discharging vapors into which the working fluid supplied to the heat-receiving plate is evaporated by heat; and a heat dissipater provided at a location higher than the heat-receiving unit and dissipating heat of the vapor passing through the outlet pipe. Slits are provided to the heat-receiving plate on a surface surrounded by an external circumference of the inlet pipe toward outside of the heat-receiving plate.

16 Claims, 30 Drawing Sheets

(56) References Cited

U.S. PATENT DOCUMENTS

| | | |
|---|---|---|
| 6,496,367 B2 | 12/2002 | Donahoe et al. |
| 6,549,408 B2 * | 4/2003 | Berchowitz .................. 361/700 |
| 6,564,861 B1 | 5/2003 | Miyazaki et al. |
| 6,845,625 B1 * | 1/2005 | Pokharna ........................ 62/118 |
| 2003/0188858 A1 | 10/2003 | Miyazaki et al. |
| 2003/0205363 A1 * | 11/2003 | Chu et al. ..................... 165/80.3 |
| 2005/0172644 A1 | 8/2005 | Zhang et al. |
| 2006/0171801 A1 | 8/2006 | Manabe et al. |
| 2007/0125526 A1 | 6/2007 | Satou et al. |
| 2008/0104970 A1 | 5/2008 | Suzuki et al. |
| 2008/0128114 A1 * | 6/2008 | Lai et al. ..................... 165/80.4 |
| 2008/0236797 A1 | 10/2008 | Miyazaki et al. |
| 2010/0073879 A1 * | 3/2010 | Tsai .............................. 361/697 |

FOREIGN PATENT DOCUMENTS

| | | |
|---|---|---|
| JP | 61-259032 | 11/1986 |
| JP | H02-140173 | 11/1990 |
| JP | 10-213370 A | 8/1998 |
| JP | 2000-236055 | 8/2000 |
| JP | 2001-077256 | 3/2001 |
| JP | 2002-115981 | 4/2002 |
| JP | 2002-163041 | 6/2002 |
| JP | 2003-229689 A | 8/2003 |
| JP | 2003-302178 A | 10/2003 |
| JP | 2005-19904 | 1/2005 |
| JP | 2006-147704 | 6/2006 |
| JP | 3124917 | 8/2006 |
| JP | 2007-150216 | 6/2007 |

OTHER PUBLICATIONS

English language Abstract of JP 2003-229689 A, Aug. 15, 2003.
English language Abstract of JP 2003-302178 A, Oct. 24, 2003.

* cited by examiner

CROSS-SECTIONAL VIEW B-B

DETAIL OF PORTION A

CROSS-SECTIONAL VIEW B-B

DETAIL OF PORTION A

CROSS-SECTIONAL VIEW B-B

DETAIL OF PORTION A

CROSS-SECTIONAL VIEW B-B

DETAIL OF PORTION A

CROSS-SECTIONAL VIEW B-B

DETAIL OF PORTION A

CROSS-SECTIONAL VIEW B-B

DETAIL OF PORTION A

CROSS-SECTIONAL VIEW B-B

DETAIL OF PORTION A

CROSS-SECTIONAL VIEW B-B

DETAIL OF PORTION A

HEATSINK APPARATUS AND ELECTRONIC DEVICE HAVING THE SAME

CROSS-REFERENCE TO RELATED APPLICATIONS

The present application claims priority under 35 U.S.C. §119 of Japanese Application Nos. 2007-254040 and 2007-254044 filed on Sep. 28, 2007, the disclosure of which is expressly incorporated by reference herein in its entirety.

BACKGROUND OF THE INVENTION

1. Field of the Invention

The present invention relates to heatsink apparatuses that cool semiconductors that produce heat, such as microprocessing units (hereinafter referred to as MPUs) used in personal computers and the like, and electronic components having heat-generating portions.

2. Description of Related Art

With higher integration of electronic components, such as semiconductors, and higher frequency of operation clocks, electronic devices have recently been generating an increasing amount of heat. An increasingly important issue in view of normal operation of the electric components is how to maintain contact temperatures of the respective electronic components within a range of an operating temperature. High integration and high frequency are so remarkable in MPUs, in particular, that heat dissipation is a critical issue in order to ensure operation stability, operation life, and the like.

A conventional air cooling system that combines a heatsink and a fan, however, is increasingly insufficient in capacity for cooling electronic components generating a large amount of heat. Thus, a high efficient heatsink apparatus having a higher capacity is proposed, in which a working fluid is circulated, as disclosed in Related Art 1, for example.

A general method of cooling heat-generating bodies generating a large amount of heat, such as MPUs and the like, is to absorb heat at a heat receiver and to dissipate the heat to air from a heat dissipater having a wide area. A conventional technology disclosed in Related Art 1 is explained below, with reference to drawings.

FIGS. 29A and 29B illustrate a configuration of a conventional heatsink apparatus and a structure of a heat receiver, respectively. As shown in FIG. 29A, the conventional heatsink apparatus normally includes heat-receiving unit 1 that removes heat from heat-generating body 2; pipeline 20 that transports a working fluid that has received heat at heat-receiving unit 1; pump 13 that moves the working fluid; and heat dissipater 11 that dissipates heat from the working fluid. A general cooling principle is described below. As shown in the drawings, heat generated in heat-generating body 2 is transferred into heat-receiving unit 1, in which heat exchange with the working fluid circulating therein increases a temperature of the working fluid. Then, the working fluid is transported by pump 13 to heat dissipater 11 through pipeline 20, thereby increasing a temperature of heat dissipater 11. Thereafter, air is fed from fan 10 mounted in the heat dissipater to a surface of heated heat dissipater 11, and thereby the heat is exchanged and dissipated into air.

With reduction in a size of electronic components (fine line manufacturing process), a size of heat-generating bodies themselves has recently been reducing. Accordingly, heat density per unit area has steadily been increasing. Cooling performance of a heatsink apparatus is determined based on performance of both a heat receiver and a heat dissipater. Due to the recent trend of increasing heat density, enhancing the performance of the heat receiver is particularly a big issue. For instance, a heatsink apparatus capable of cooling a heat-generating body having an area of 100 mm$^2$ and generating a heat of 100 W, might not be able to cool a heat-generating body having a reduced heat-generating area of 50 mm$^2$, as a result of a thin line manufacturing process of electronic components, since the size reduction doubles the heat density, thus causing insufficiency in heat absorption capacity.

The heat receiver of the working fluid circulation system, as shown in FIG. 29A, employs a structure shown in FIG. 29B. To increase performance, a pipeline is provided, in which the working fluid circulates in a metal having a high thermal conductivity (e.g., copper, aluminum, and the like). Even in this case, however, heat exchange efficiency from the metal to the working fluid inside the heat receiver significantly relies on an area of an internal wall of the pipeline. Thus, merely providing the pipeline inside the heat receiver does not generally achieve sufficient performance due to a limited heat-receiving area. In addition, insufficient performance is expected to be further remarkable in accordance with future downsizing of heat-generating bodies.

In order to fiber enhance the heat absorption performance of the heat receiver, another conventional technology is provided, as shown in FIG. 30. The conventional technology uses a heat pipe hang a cylindrical shape and closed both ends, and being provided therein with a desired working fluid. A heatsink apparatus using the heat pipe includes a heat receiver that contacts with a heat-generating body and a heat dissipater provided with heat-dissipating fins. Heat from the heat-generating body is transferred to a cylinder wall, and then a phase change (vaporization) of the working fluid occurs on an internal wall and thus draws latent heat of vaporization. Then, vapor is transferred at a high velocity in the cylinder and condenses on an internal wall of the heat dissipater. Heat of condensation is transferred to the fins through the internal wall, and eventually dissipated into air. Subsequently, the condensed working fluid is transferred to the original heat generator by a wick provided on a pipe wall to cause a capillary action. Repeating a cycle of the steps above continues cooling. Since the heat transfer involves a change of phase, the structure achieves a high heat absorption performance, compared to the simple coolant circulation system, as shown in FIGS. 29A and 29B.

[Related Art 1] Japanese Patent Laid-open Publication No. H10-213370

As described above, however, more heat tends to be generated, or heat density tends to be increased, in accordance with further performance increase and the like of electronic components, such as semiconductors. The alternative conventional heatsink apparatus that uses the heat pipe, as shown in FIG. 30, can contain only a small amount of working fluid due to a limited inner capacity. Since a heat pipe used for electronic components mainly has a heat transport capacity of several tens of W level per unit, a plurality of heat pipes are commonly provided in parallel, in order to increase a total heat transport capacity. Although the total heat transport capacity can be increased to a certain level by increasing the number of heat pipes, the problem of heat density increase remains as described above. A measure taken for the problem is to provide heat pipes in parallel on a heat-receiving plate having a high thermal conductivity so as to expand heat as much as possible. Even the measure, however, has a limit in the number of practically functioning heat pipes in view of arrangement. There is still a difficulty remaining in both achieving sufficient heat transport capacity and solving the high heat density issue. Id addition, when a relatively thick heat-receiving plate is used to expand more heat to the plurality of heat pipes, a distance is accordingly longer from the center of a heat-generating body to a vaporization surface where the phase change (vaporization) of the working fluid actually occurs. Thereby, thermal resistance between the center and the vaporization surface increases, thus causing a sharp temperature increase during a time from an onset of heating to an onset of an actual phase change (vaporization), and surpassing a guaranteed operation temperature of electronic components.

SUMMARY OF THE INVENTION

The present invention is provided to address the above-described problems. A purpose of the present invention is to provide a heatsink apparatus having a high operation stability and an excellent cooling performance, the heatsink apparatus being capable of maintaining a high heat-receiving performance and of preventing a sharp temperature increase and dryout at an initial stage of heating.

In order to achieve the above-described purpose, the present invention provides a heatsink apparatus performing cooling by circulating a working fluid and causing a phase change between a liquid phase and a gas phase, and provided on one surface of an external wall with a heat-generating body. The heatsink apparatus includes a box-shaped heat receiver transferring heat to an internal wall corresponding to the surface of the external wall; an inlet pipe supplying the working fluid into the heat receiver; an outlet pipe discharging vapor, into which the working fluid supplied into the heat receiver is evaporated by heat; and a heat dissipater provided at a location higher than the heat receiver and dissipating heat of the vapor passing through the outlet pipe. Slits are provided in the internal wall from inside to outside on a surface surrounded by an external circumference of an opening of the inlet pipe.

As described above, the heatsink apparatus according to the present invention is provided with the slits in the internal wall from inside to outside on the surface surrounded by the external circumference of the opening of the inlet pipe. Thus, a heatsink apparatus can be provided having a high operation stability and an excellent cooling performance, the heatsink apparatus being capable of maintaining a high heat-receiving performance and of preventing a sharp temperature increase and dryout at an initial stage of heating.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF PREFERRED EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

The embodiments of the present invention are explained below with reference to the drawings.

First Embodiment

Figure 1A:
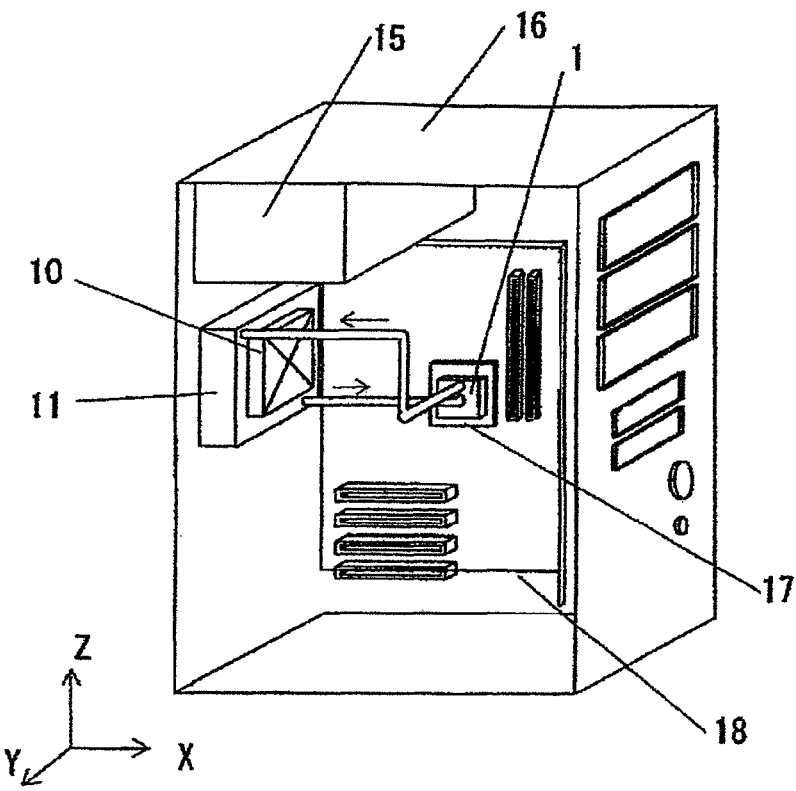
FIG. 1A is a perspective view when a heatsink apparatus according to a first embodiment of the present invention is provided in a PC unit.
Figure 1B:
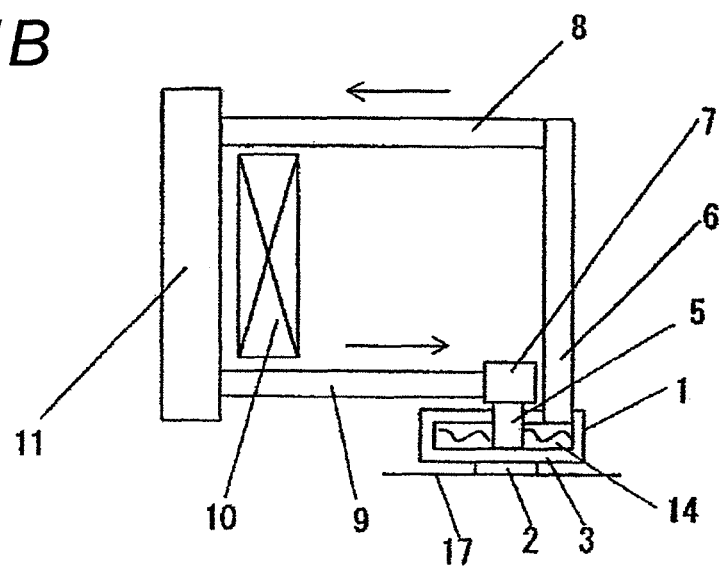
FIG. 1B illustrates a structure of the heatsink apparatus.

FIG. 1A is a perspective view when a heatsink apparatus according to a first embodiment of the present invention is provided in a personal computer (hereinafter referred to as a PC) unit; and FIG. 1B illustrates a structure of the heatsink apparatus of the present invention. As shown in FIG. 1A, PC unit 16 includes the heatsink apparatus according to the present invention, along with PC components, such as power source unit 15, motherboard 18, and the like. The heatsink apparatus includes box-shaped heat-receiving unit 1, which is connected to socket 17 of a heat-generating body, heat dissipater 11; and fan 10, which cools heat dissipater 11.

More specifically, the heatsink apparatus according to the present invention includes three main components and circulation components, as shown in FIG. 1B. The three main components are box-shaped heat-receiving unit 1, which includes heat-receiving plate 3; heat dissipater 11; and check valve 7, which determines a circulation direction of a working fluid. The circulation components are inlet pipe 5, which connects check valve 7 and heat-receiving unit 1; outlet pipe 6, which discharges the working fluid from heat-receiving unit 1; pipeline 8, which connects outlet pipe 6 and heat dissipater 11; and pipeline 9, which connects check valve 7 and heat dissipater 11.

Figure 2A:
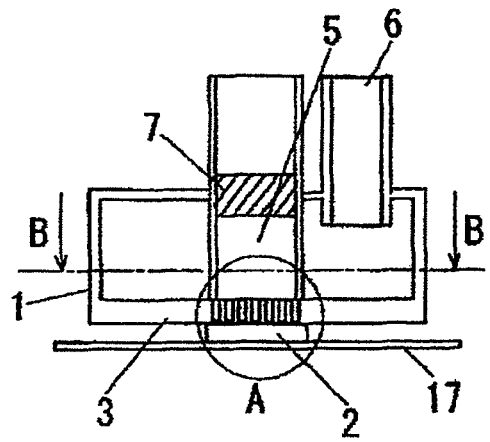
FIG. 2A is a central vertical cross-sectional view of a heat-receiving unit according to the first embodiment of the present invention.
Figure 2C:
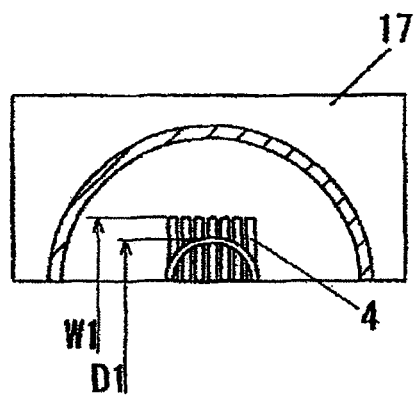
FIG. 2C is a horizontal cross-sectional view of the heat-receiving unit of FIG. 2A.
Figure 2B:
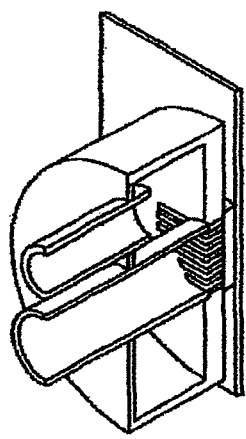
FIG. 2B is a cross-sectional perspective view of the heat-receiving unit of FIG. 2A.
Figure 2D:
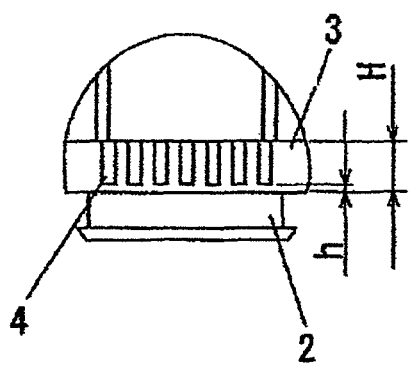
FIG. 2D is a cross-sectional detail view of portion A in FIG. 2A.

The structure of heat-receiving unit 1 is explained in detail with reference to FIGS. 2A to 2D. FIG. 2A is a central vertical cross-sectional view of the heat-receiving unit according to the first embodiment of the present invention; FIG. 2B is a cross-sectional perspective view of the heat-receiving unit of FIG. 2A; FIG. 2C is a horizontal cross-sectional view of the heat-receiving unit of FIG. 2A; and FIG. 2D is a cross-sectional detail view of portion A in FIG. 2A. FIG. 2A shows entire heat-receiving unit 1, which includes heat-generating body 2 and heat-receiving plate 3. Heat-receiving plate 3 contacts with heat-generating body 2 and absorbs heat therefrom. Material having a low thermal resistance, such as, for example, copper, aluminum, and the like, is used for the heat-receiving plate. As shown in FIG. 2A, slits 4 are provided in substantially parallel inside heat-receiving plate 3 of heat-receiving unit 1 and proximate to and immediately above the heat-generating body. Inlet pipe 5 is disposed covering slits 4, such that inlet pipe 5 contacts with heat-receiving plate 3 or has a slight gap with heat-receiving plate 3. Specifically, as shown in FIG. 2C, length W1 of slits 4 is provided greater than pipe diameter D1 of inlet pipe 5, such that inlet pipe 5 covers a central portion of slits 4 provided proximate to and immediately above the heat-generating body.

Operations are explained below of the heatsink apparatus of the present invention having the above-described structure. When heat-generating body 2 generates heat, the heat, which is transferred from heat-generating body 2 to heat-receiving plate 3, causes working fluid 14 in heat-receiving unit 1 to change its phase (vaporize) on a heat-receiving plate 3 surface (hereinafter referred to as a vaporization surface) inside heat-receiving unit 1. Then, vapor receives the heat as latent heat of vaporization and cools heat-generating body 2. The evaporated vapor passes through pipeline 8 from outlet pipe 6 in a direction of an arrow, and then flows into heat dissipater 11. The vapor, which is cooled inside heat dissipater 11, condenses and liquefies. Heat of condensation associated with the liquefaction dissipates and increases a temperature of the heat dissipater. Then, air is fed from fan 10 provided on the heat dissipater to a surface of heated heat dissipater 11, thus causing heat exchange and eventually dissipating the heat into air. Thereafter, liquefied working fluid 14 passes through pipeline 9 and check valve 7, which is provided immediately before heat-receiving unit 1, and then returns through inlet pipe 5 inside heat-receiving unit 1. Repeating a cycle of the steps above continues cooling.

Figure 3A:
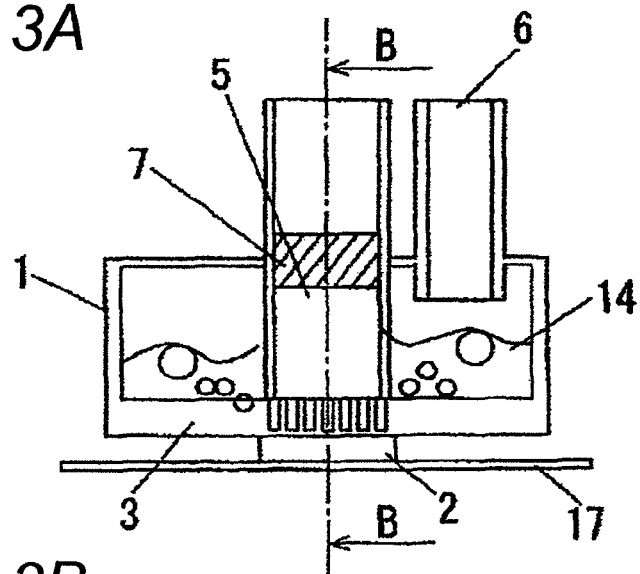
FIG. 3A is a central vertical cross-sectional view of the heat-receiving unit according to the first embodiment of the present invention.
Figure 3B:
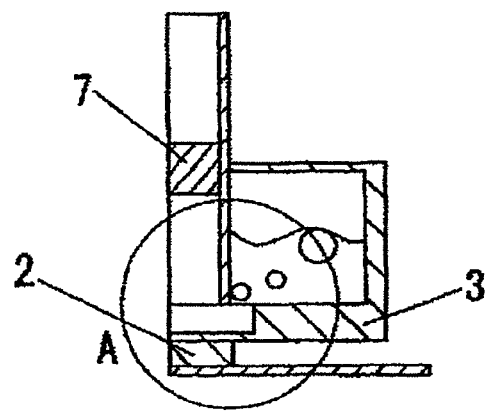
FIG. 3B is a central vertical cross-sectional view of the heat-receiving unit viewed from an angle of 90 degrees.
Figure 3C:
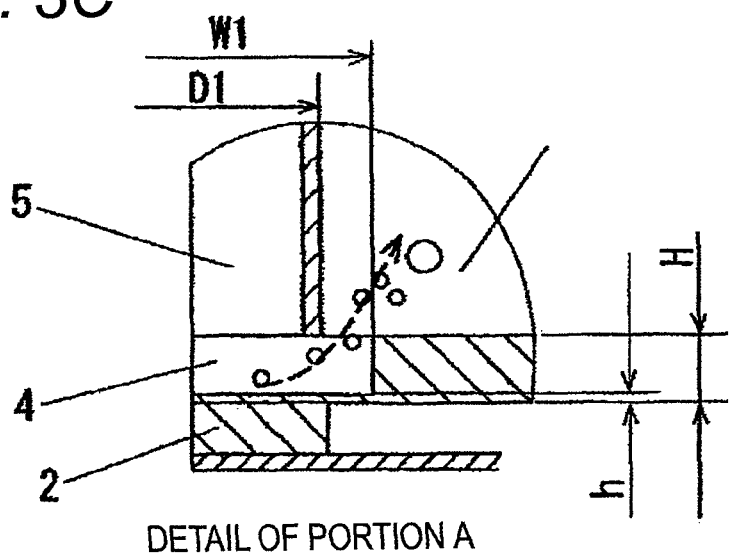
FIG. 3C is a cross-sectional detail view of a slit section at portion A of the heat-receiving unit.

The operations proximate to heat-receiving plate 3 are further explained with reference to FIGS. 3A to 3C. FIG. 3A is a central vertical cross-sectional view of the heat-receiving unit same as shown in FIG. 2A; FIG. 3B is a central vertical cross-sectional view of the heat-receiving unit viewed from a different cut-out angle by 90 degrees; and FIG. 3C is a cross-sectional detail view of the slit section at portion A. As shown in FIG. 3C, working fluid 14 flowing in from inlet pipe 5 into slits 4 contacts with the heat-receiving surface most proximate to the heat-generating body when passing through inside slits 4. The working fluid then changes its phase (vaporizes) in an amount according to a heat-generating amount. At this time, latent heat of vaporization is drawn from the heat-receiving surface, and concurrently bubbles form due to cubical expansion associated with the phase change. Since an internal pressure of inlet pipe 5 increases, the bubbles and unvaporized working fluid 14 are discharged in a multiphase flow to outlet pipe 6. Inlet pipe 5 is provided with check valve 7. The pressure increase herein occurs on the outlet side beyond check valve 7, and thus determining a circulation direction of working fluid 14. Bottom thickness h of the slit section is considerably thin compared to heat-receiving plate thickness H.

When slit bottom thickness h is thin, thermal resistance due to the thickness can be reduced. Even when a heat-generating amount is the same, the working fluid thus reaches a vaporization temperature in a relatively short time and starts vaporization. Thereby, temperature increase is prevented on the heat-receiving surface at an initial stage of heating. Further, providing slits 4 ensures a sufficient vaporization area concurrently, hereby enhancing heat absorption performance.

In order to discharge the bubbles in slits 4 along with unvaporized working fluid 14 by the above-described pressure increase, channel resistance at the gap between heat-receiving plate 3 and inlet pipe 5 needs to be greater than that at slits 4.

Specifically, when no gap is provided between heat-receiving plate 3 and inlet pipe 5 in a portion in which no slits 4 are provided, no working fluid 14 is discharged from the gap between heat-receiving plate 3 and inlet pipe 5 in the portion in which no slits 4 are provided. Thus, the working fluid is only discharged from slits 4, and thereby the bubbles forming in slits 4 can be effectively discharged by the flow of working fluid 14.

Even when a gap is provided between heat-receiving plate 3 and inlet pipe 5, working fluid 14 easily flows inside slits 4 when a depth or width of slits 4 is selected such that the channel resistance of slits 4 is less than that of the gap where no slits 4 are provided.

Figure 4:
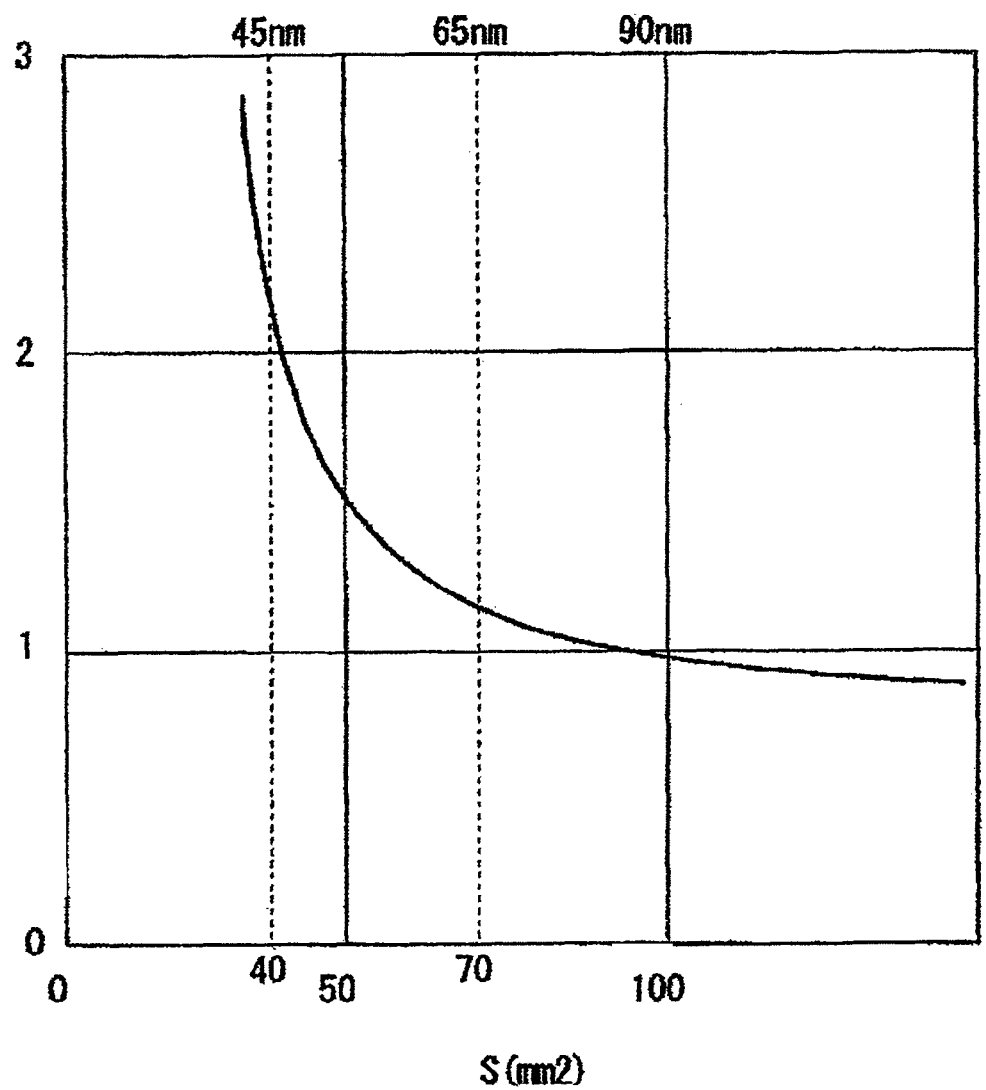
FIG. 4 is a graph illustrating a change of standardized thermal resistance when a heat generation size is changed.

As described above, electronic components are generally cooled, when heat is absorbed from a contact surface (hereinafter referred to as a heat-receiving surface) of heat-generating body 2 and heat-receiving plate 3 of heat-receiving unit 1, which is in contact with heat-generating body 2; is transferred to fins; and is drawn by heat exchange with the working fluid flowing through the fins, whereby heat-generating body 2 is cooled. A size of heat-generating body 2 has steadily been reducing, however, in accordance with recent size and cost reduction. Even when a heat-generating amount itself remained substantially the same, heat density (a heat-generating amount per unit area) from heat-generating body 2 would sharply increase inversely with the size. The issue indicates, as described above, that heat absorption performance would significantly decline with a same heatsink apparatus. FIG. 4 illustrates a reason behind the issue. A graph in the drawing shows a change of experimentally obtained thermal resistance, in a case where a heat-generating size is changed while a heat-generating amount is fixed with a same heatsink apparatus. A horizontal axis indicates a size of heat-generating body 2 (area S: $mm^2$), and a vertical axis indicates a standardized thermal resistance ratio (R1/R0) of thermal resistance R0 of a heatsink apparatus when the heat-generating size is 100 $mm^2$, and thermal resistance R1 when the size is reduced. Further, a minimum line width of sample generations is provided on an upper horizontal axis, the minimum line width being required in a semiconductor process to achieve each size in the future. The graph demonstrates that when the heat-generating size is reduced, the thermal resistance is rapidly aggravated. The aggravation stems from the increase in heat density associated with the reduction in heat-generating size, as described above, thereby indicating a substantial decline in heat absorption performance of the heatsink apparatus. In addition, a generation change of the minimum line width indicated herein generally occurs every two to three years. Along with an increase in the number of semiconductor elements during the period, the size is expected to be reduced to as much as 70% in one generation. Accordingly, an issue has significantly been obvious that it is more and more difficult to practically ensure the heat absorption performance that keeps up with the heat density increase associated with the generation change.

The performance increase of the heat receiver is thus urgently required to address the problem. For this purpose, it is effective to take advantage of latent heat of vaporization associated with a phase change, such as vaporization, in order to increase the heat absorption performance, as described above. An actual phase change, however, requires a certain amount of vaporization area for vaporization. Particularly, the smaller a size of an element, or a heat-generating body, is, the more difficult it is to secure a vaporization area of a working fluid, which is a heat exchange area immediately above the element. There are two methods to expand the vaporization area. A first method is to lay out fins as densely as possible immediately above the heat-generating body. A second method is to thicken a thickness of heat-receiving plate 3 so as to provide a long distance from heat-generating body 2, thereby broadening a heat diffusion area and thus ensuring a vaporization area. The first method of densely providing the fins has conventionally been employed, as represented in a microchannel. The method can increase the vaporization area according to the fin density increase. The method is disadvantageous, however, since the higher the fin density is, the significantly more difficult production is, including cost.

Further, conventional microchannel fins are densely arranged in a micron order. The structure requires a pump to flow the working fluid through the fins.

The second method of thickening the heat-receiving plate is easy in view of cost and production. In order to secure a sufficient vaporization area with this method, however, a substantial thickness is still required, thus causing an increase in thermal resistance and in weight. The increase in thermal resistance, in particular, is highly likely to cause a sharp temperature increase at an initial stage of heating, in which a phase change starts. Thus, a structure that can appropriately address the problems is required.

In view of the problems, the present invention employs a structure in which the plurality of slits are provided in a milli-order in the heat-receiving plate proximate to the inlet pipe. Thereby, without using a pump, the present invention achieves a heatsink apparatus having an excellent heat absorption performance, the heatsink apparatus ensuring a sufficient vaporization area and preventing temperature increase at an initial stage of heating.

Figure 5:
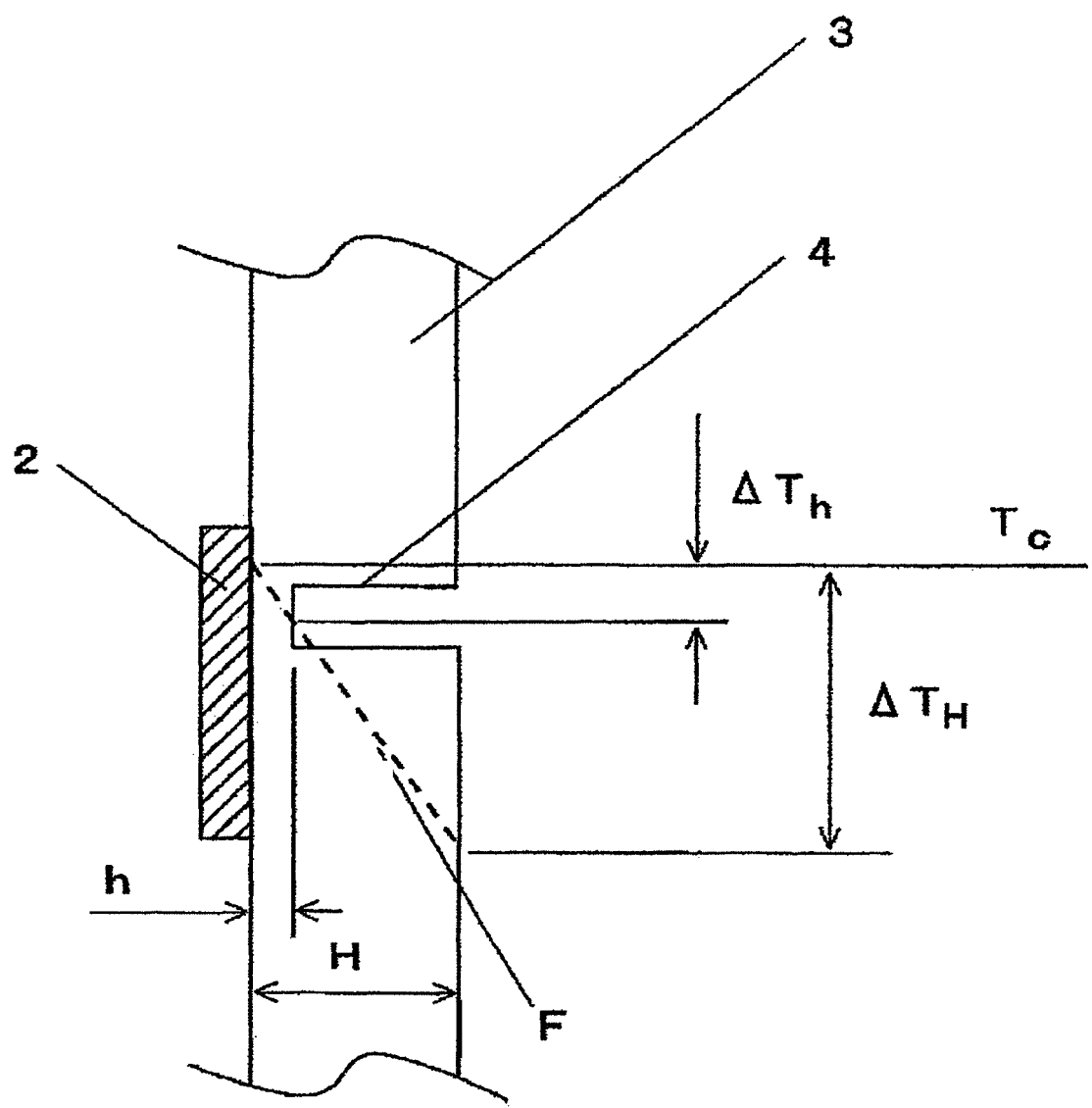
FIG. 5 illustrates temperature distribution when a slit is provided in a heat-receiving plate according to the first embodiment of the present invention.

The effect of preventing temperature increase of heat-generating body 2 at the initial stage of heating is explained with reference to FIGS. 5 and 6. FIG. 5 is a schematic view illustrating temperature distribution F when slits 4 are provided in heat-receiving plate 3. Temperature distribution F on the heat-receiving surface is represented by temperature difference $\Delta T_h$ at a bottom portion of slits 4 (plate thickness h) and temperature difference $\Delta T_H$ ($>\Delta T_h$) on heat-receiving plate 3 (plate thickness U), when a temperature of heat-generating body 2 is $T_c$. As indicated in the drawing, the thicker the plate thickness is, the greater the temperature difference is. Specifically, when the temperature of heat-generating body 2 is $T_c$, the temperature at the bottom portion of slits 4 is $T_c - \Delta T_h$, and the temperature on the surface of heat-receiving plate 3 is $T_c - \Delta T_H$. Thus, the shorter a distance from heat-generating body 2, in other words, the thinner the heat-receiving plate is, the smaller the temperature difference with heat-generating body 2 is. As a result, the temperature of heat-generating body 2 can be lowered when vaporization occurs in slits 4, compared to the temperature that heat-generating body 2 requires when vaporization occurs on heat-receiving plate 3 having no slits 4.

Figure 6:
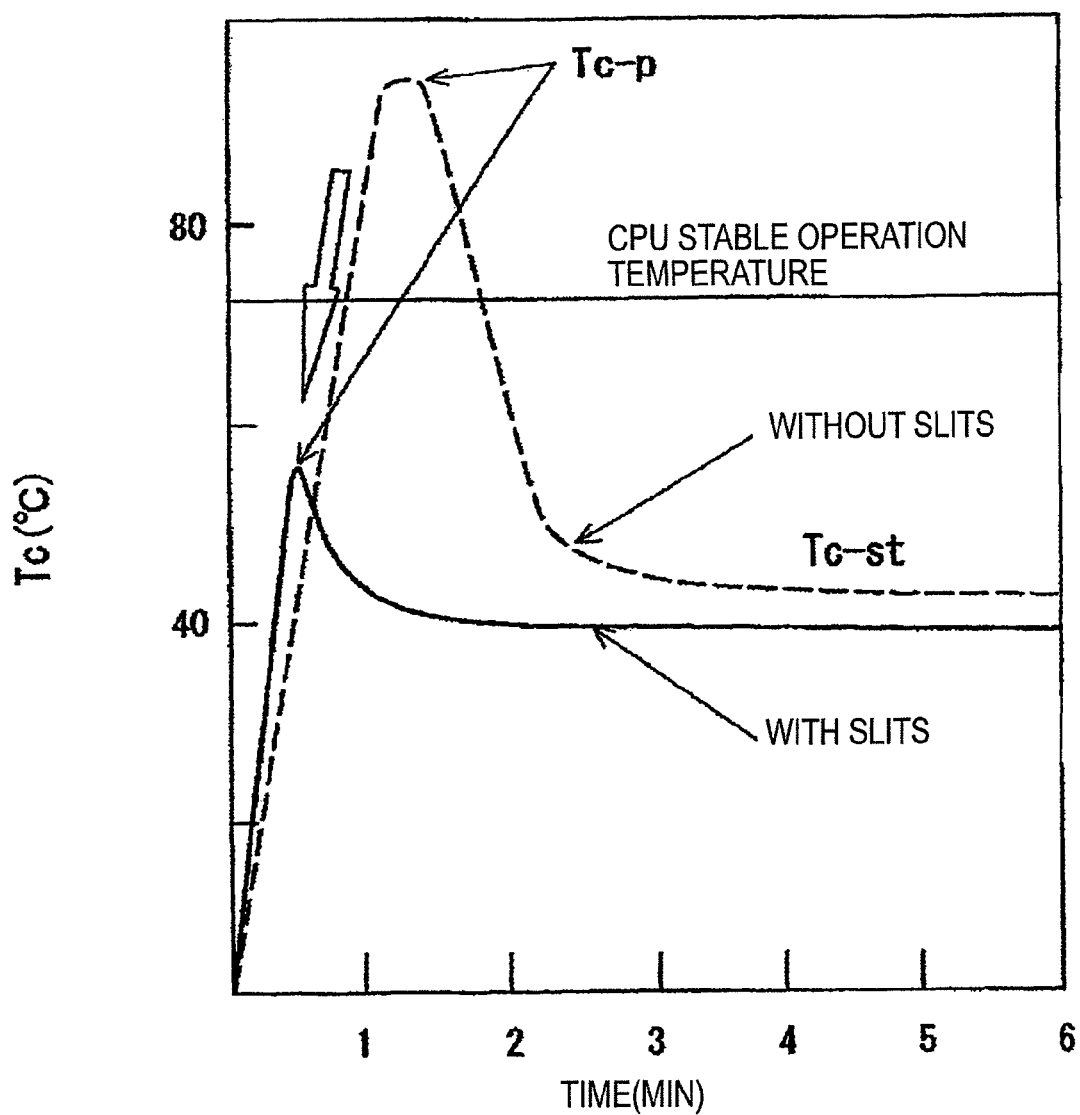
FIG. 6 is a graph illustrating a change of temperature at an initial stage of heating, obtained with a heat receiver according to the first embodiment of the present invention.

FIG. 6 is a graph illustrating a time and a change of temperature on the heat-receiving surface when slits 4 are provided and not provided in heat-receiving plate 3. A horizontal axis indicates a time (minute) from an onset of heating; and a vertical axis indicates temperature $T_c$ of the heat-receiving surface, which is a contact surface of heat-generating body 2 and heat-receiving plate 3. The graph illustrates a change of temperature at an initial stage of heating and a transition to a stable state, with and without the slits. The graph shows that the temperature sharply increases immediately after the onset of heating when no slits are provided in a conventional case. Highest temperature $T_{c-p}$ exceeds a stable operating temperature of electric components (around 75 degrees in case of CPUs), and, in this state, it is highly likely that thermorunaway occurs at an initial power-on stage. Conversely, when the slits are provided according to the present invention, the temperature slightly increases immediately after the onset of heating, but the temperature moves to the stable state immediately thereafter, and highest temperature $T_{c-p}$ can also be suppressed below the stable operating temperature. In addition, providing the slits increases a vaporization area, thereby reducing temperature in the stable state $T_{c-st}$ and improving the heat absorption performance.

Figure 7:
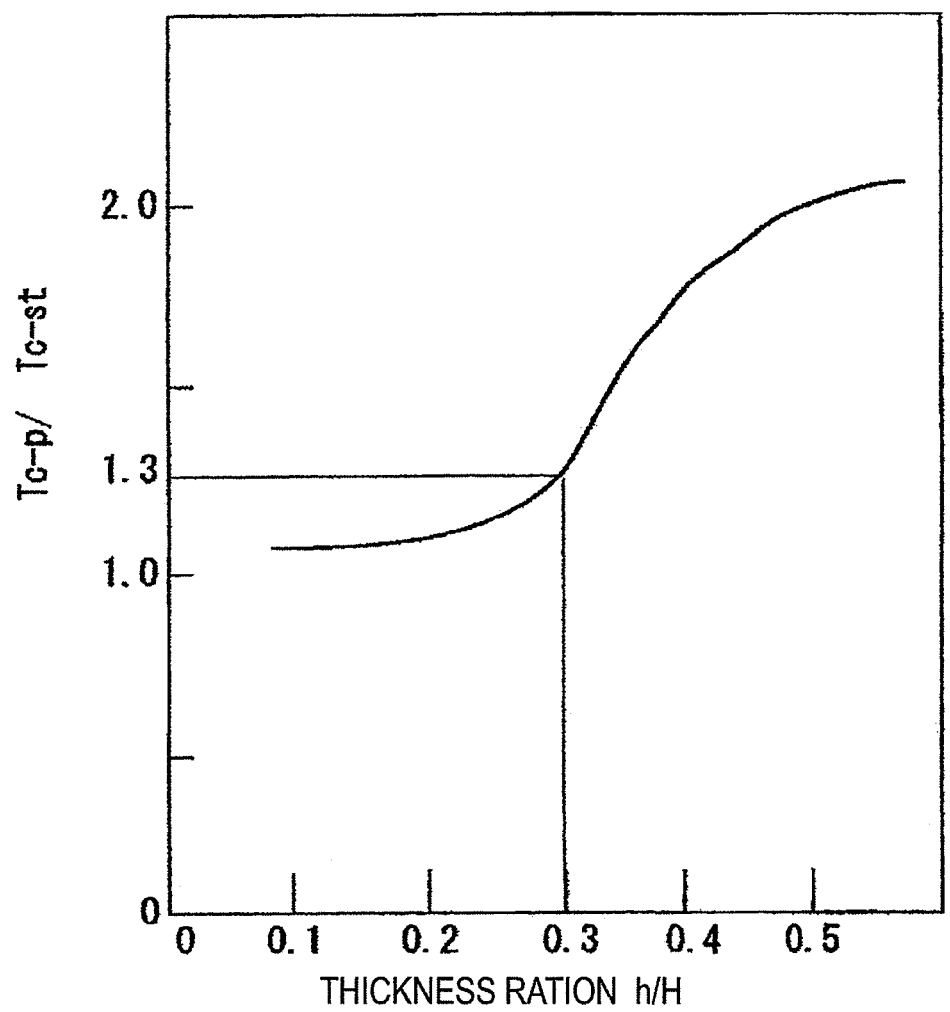
FIG. 7 is a graph illustrating a relation between a ratio of a thickness of the heat-receiving plate and a bottom thickness of the slit section, and a temperature ratio at the initial stage of heating, according to the first embodiment of the present invention.

The bottom thickness of slits 4 is explained with reference to FIG. 7. FIG. 7 is a graph illustrating a relation of a thickness ratio and a temperature ratio, in a case where thickness H of heat-receiving plate 3 is 4 mm as an example. A horizontal axis indicates the thickness ratio (h/H) of thickness H of the heat-receiving plate and bottom thickness h of the slit section. A vertical axis indicates the temperature ratio ($T_{c-p}/T_{c-st}$) of highest temperature $T_{c-p}$ at the initial stage of heating and stable state temperature $T_{c-st}$ on the heat-receiving surface. The graph shows that the temperature ratio is approximately 1.3 or less when the thickness ratio is 0.3 or less, and that the temperature increase is suppressed to an approximately 30% level from stable state temperature $T_{c-st}$.

It does not necessarily mean, however, that heat-receiving plate 3 is practically better when slit bottom thickness h is thinner. When slit bottom thickness h is thinner than a certain level, the temperature ratio is no longer reduced. Further, when the slit bottom is extremely thin, the mechanical strength also declines. These issues need to be taken into account when bottom thickness h, width, number and layout interval of the slits are considered.

Since being provided with the slits on an internal wall of the heat receiver, the heatsink apparatus of the present invention can reduce the thermal resistance because of the thin slit bottom thickness. Thereby, even when a heat-generating amount is the same, the vaporization temperature is achieved within a relatively short period of time, and vaporization starts. Thus, the temperature increase is prevented on the heat-receiving surface at the initial stage of heating.

In addition, providing the slits on the internal wall allows the internal wall surface to have a large surface area, thus improving heat transfer performance of the internal wall.

Furthermore, the slits are provided on the internal wall from inside to outside on a surface surrounded by an external circumference of an opening of the inlet pipe. Thereby, pressure increase associated with vaporization of the working fluid discharges bubbles forming inside the slits from inside to outside of the surface surrounded by the external circumference of the opening along the slits, and vaporization of the working fluid is not interrupted due to bubble trap. Thus, the heat absorption performance of the heat receiver is increased and the performance of the heatsink apparatus is enhanced.

When the gap between heat-receiving plate 3 and inlet pipe 5 is 0.2 mm or less, a flow of working fluid 14 can remove bubbles forming in slits 4 and reduce an amount of bubbles trapped in slits 4. Consequently, the phase chase, or vaporization, of working fluid 14 is accelerated on the surface of heat-receiving plate 3 provided with slits 4, and thus total heat absorption performance of heat-receiving unit 1 is enhanced.

When slits 4 are provided obliquely or with a curvature, formed bubbles are easily discharged to an upper space by the flow of working fluid 14, thus reducing bubble trap in slits 4.

Second Embodiment

In a second embodiment, the slits of the first embodiment are provided radially. For explanation purposes, identical reference numerals are provided to components identical to those in the first embodiment, and specific explanations thereof in the first embodiment are referred to.

Figure 8A:
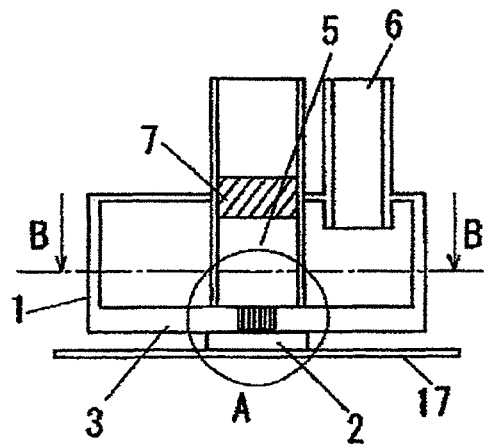
FIG. 8A is a central vertical cross-sectional view of an alternative heat-receiving unit according to a second embodiment of the present invention.
Figure 8B:
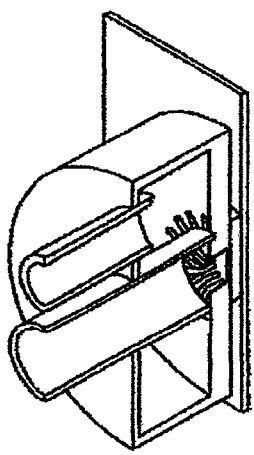
FIG. 8B is a cross-sectional perspective view of the heat-receiving unit.
Figure 8C:
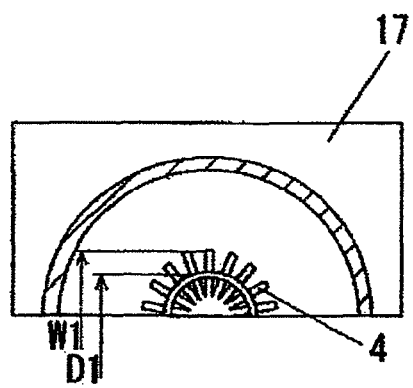
FIG. 8C is a horizontal cross-sectional view of the heat-receiving unit.
Figure 8D:
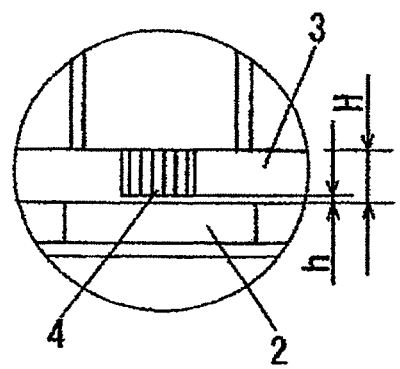
FIG. 8D is a cross-sectional detail view of a slit section at portion A.

A heatsink apparatus according to the second embodiment of the present invention is explained with reference to FIGS. 5A to 8D. FIG. 8A is a central vertical cross-sectional view of an alternative heat-receiving unit according to the second embodiment of the present invention; FIG. 8B is a cross-sectional perspective view of the heat-receiving unit of FIG. 8A; FIG. 8C is a horizontal cross-sectional view of the heat-receiving unit of FIG. 8A; and FIG. 8D is a cross-sectional detail view of portion A shown in FIG. 8A. As shown in FIG. 8A, slits 4, which are provided in heat-receiving plate 3 of heat-receiving unit 1 immediately above a heat-generating body, have a radial shape extending from a central axis of the heat-generating body. Employing the slit structure allows a heat-receiving plate thickness proximate to and immediately above the heat-generating body to have slit bottom thickness h that can function as a vaporization surface having a low thermal resistance when the slits have a same width. A relatively extensive range of thin bottom thickness h can be secured, compared to the type of FIGS. 2A to 2D. Thus, the structure can achieve a high heat absorption performance, similar to the case of FIGS. 2A to 2D.

Third Embodiment

In a third embodiment, slits are not provided at a central portion of heat-receiving plate 3 contacting with heat-generating body 2. For explanation purposes, identical reference numerals are provided to components identical to those in the first and second embodiments, and specific explanations thereof in the first and second embodiments are referred to.

Figure 9A:
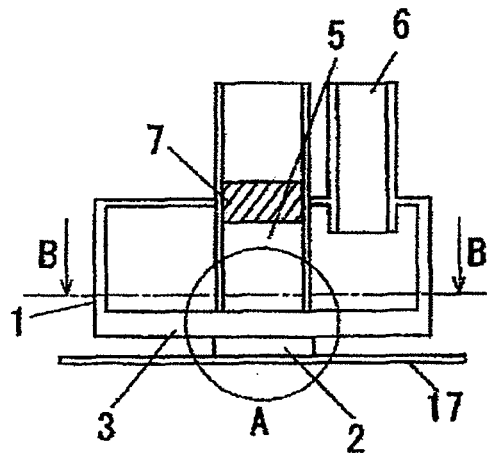
FIG. 9A is a central vertical cross-sectional view of a heat-receiving unit according to a third embodiment of the present invention.
Figure 9B:
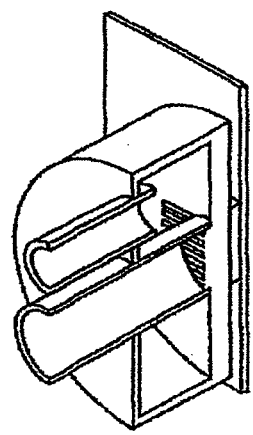
FIG. 9B is a cross-sectional perspective view of the heat-receiving unit.
Figure 9C:
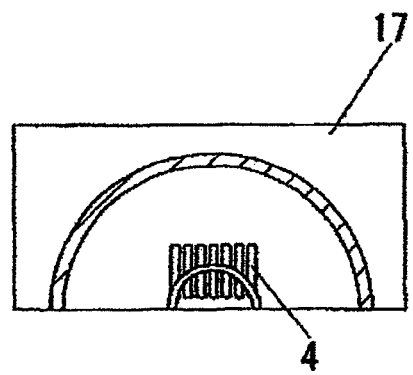
FIG. 9C is a horizontal cross-sectional view of the heat-receiving unit.
Figure 9D:
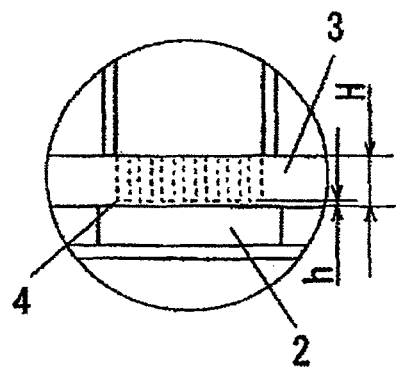
FIG. 9D is a cross-sectional detail view of a slit section at portion A.

A case where slits 4 are provided in parallel is first explained with reference to FIGS. 9A to 9D. FIG. 9A is a central vertical cross-sectional view of heat-receiving unit 1 according to the third embodiment of the present invention; FIG. 9B is a cross-sectional perspective view of the heat-receiving unit of FIG. 9A; FIG. 9C is a horizontal cross-sectional view of the heat-receiving unit of FIG. 9A; and FIG. 9D is a cross-sectional detail view of portion A shown in FIG. 9A. As shown in FIG. 9A, slits 4, which are provided substantially in parallel in heat-receiving plate 3 of heat-receiving unit 1 immediately above a heat-generating body, are provided so as to avoid a portion immediately above heat-generating body 2. More specifically, a portion immediately above heat-generating body 2 has original thickness H of the heat-receiving plate and directly connects to a portion having thickness H of the heat-receiving plate around the heat-generating body. In the cases of FIGS. 2A to 2D and FIGS. 5A to 5D of the second embodiment, it is considered, as described above, that the mechanical strengths is possibly insufficient depending on the density of slits. In the present embodiment, therefore, employing the structure shown in FIGS. 9A to 9D maintains a required mechanical strength Selecting an appropriate slit density provides a heatsink apparatus having an excellent heat absorption performance, the heatsink apparatus ensuring a sufficient vaporization area and preventing temperature increase at an initial stage of heating.

Figure 10A:
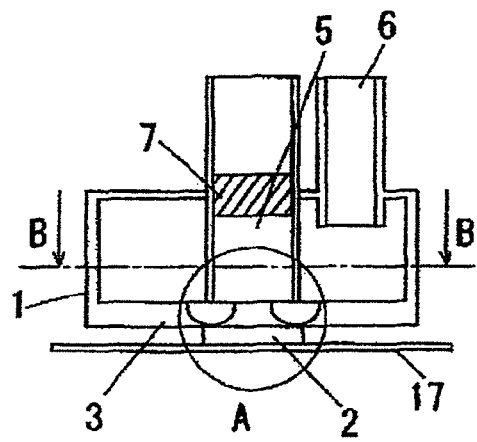
FIG. 10A is a central vertical cross-sectional view of a heat-receiving unit according to the third embodiment of the present invention.
Figure 10B:
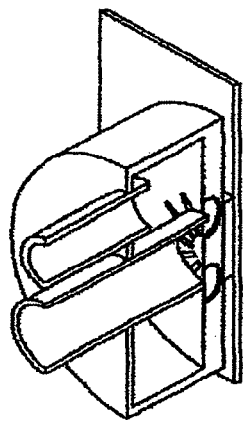
FIG. 10B is a cross-sectional perspective view of the heat-receiving unit.
Figure 10C:
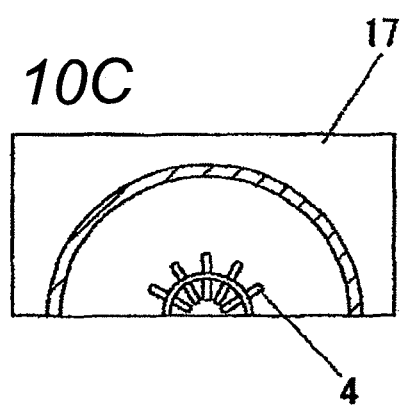
FIG. 10C is a horizontal cross-sectional view of the heat-receiving unit.
Figure 10D:
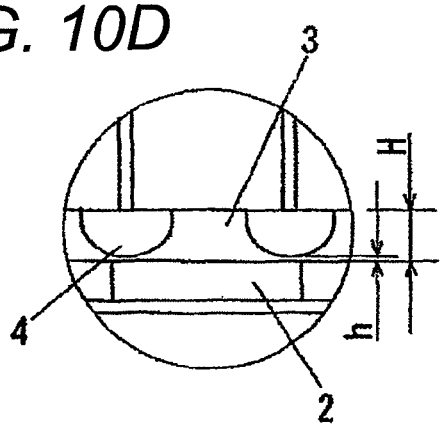
FIG. 10D is a cross-sectional detail view of a slit section at portion A.

A case where slits 4 are provided radially is explained next with reference to FIGS. 10A to 10D. FIG. 10A is a central vertical cross-sectional view of heat-receiving unit 1 according to the third embodiment of the present invention; FIG. 10B is a cross-sectional perspective view of the heat-receiving unit of FIG. 10A; FIG. 10C is a horizontal cross-sectional view of the heat-receiving unit of FIG. 10A; and FIG. 10D is a cross-sectional detail view of a slit section at portion A shown in FIG. 10A. As shown in FIG. 10A, a basic Structure is identical to the case of FIGS. 8A to 8D. Slits 4 provided in heat-receiving plate 3 are provided radially from the center of the heat-generating body. However, slits 4 provided in heat-receiving plate 3 of heat-receiving 1 immediately above the heat-generating body, are provided radially so as to avoid a portion immediately above heat-generating body 2, similar to the case of FIGS. 9A to 9D. More specifically, a portion immediately above heat-generating body 2 has original thickness H of the heat-receiving plate and directly connects to a portion having thickness H of the heat-receiving plate around the heat-generating body. Similar to the case of FIGS. 9A to 9D, employing the structure therefore maintains a required mechanical strength, and selecting an appropriate slit density provides a heatsink apparatus having an excellent heat absorption performance, the heatsink apparatus ensuring a sufficient vaporization area and preventing temperature increase at the initial stage of heating.

Fourth Embodiment

In a fourth embodiment, a width of slits 4 is gradually wider as the slits extend away from heat-generating body 2, in order to further enhance heat-absorption performance. For explanation purposes, identical reference numerals are provided to components identical to those in the first to third embodiments, and specific explanations thereof in the first to third embodiments are referred to.

Figure 11A:
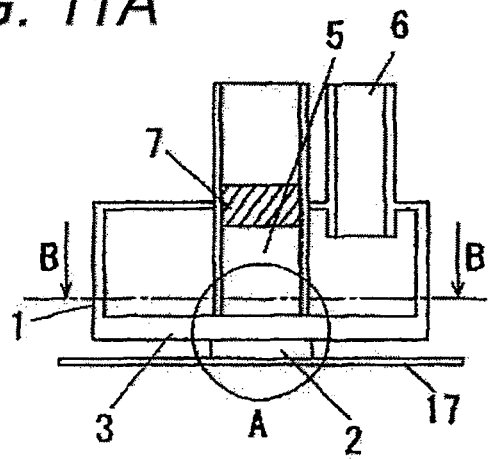
FIG. 11A is a central vertical cross-sectional view of a heat-receiving unit according to a fourth embodiment of the present invention.
Figure 11C:
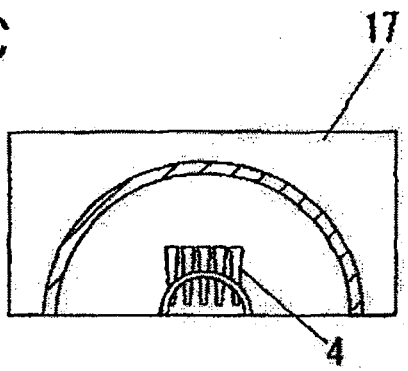
FIG. 11C is a horizontal cross-sectional view of the heat-receiving unit.
Figure 11B:
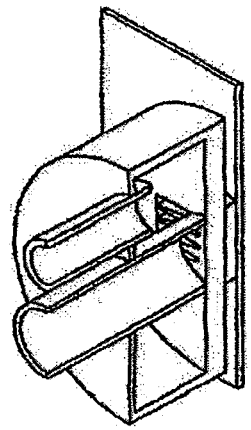
FIG. 11B is a cross-sectional perspective view of the heat-receiving unit.
Figure 11D:
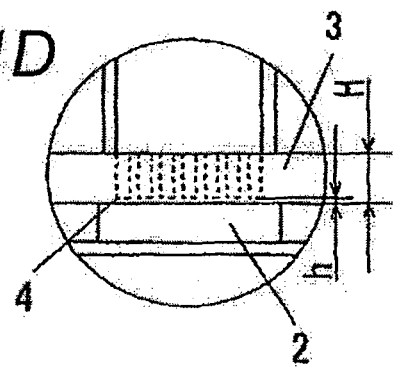
FIG. 11D is a cross-sectional detail view of a slit section at portion A.

A case where slits 4 are provided in parallel is first explained with reference to FIGS. 11A to 11D. FIG. 11A is a central vertical cross-sectional view of heat-receiving unit 1 according to the fourth embodiment of the present invention; FIG. 11B is a cross-sectional perspective view of the heat-receiving unit of FIG. 11A; FIG. 11C is a horizontal cross-sectional view of the heat-receiving unit of FIG. 11A; and FIG. 11D is a cross-sectional detail view of a slit section at portion A shown in FIG. 11A. As shown in FIG. 11A, slits 4, which are provided in heat-receiving plate 3 of heat-receiving unit 1 immediately above a heat-generating body, are provided so as to avoid a portion immediately above heat-generating body 2, similar to the case of FIGS. 9A to 9D. A width of slits 4 immediately below inlet pipe 5, where working fluid 14 flows in, is gradually wider as the slits extend away from the center of heat-generating body 2. Employing the structure enhances detachment of bubbles of vapor, which vaporizes and forms into bubbles in slits 4 and is discharged from an opposite end of slits 4, thereby leading to stable circulation of the working fluid. Particularly, when a working fluid having a high surface tension is used, bubbles forming in slits 4 tend to be physically trapped. As a result, the working fluid is prevented from circulating, thus causing a sharp decline in heat absorption performance. The bubble detachment therefore is a critical parameter in order to ensure stable operation of an apparatus that employs a phase change. Similar to the case of FIGS. 9A to 9D, it is also possible in the fourth embodiment that a required mechanical strength is maintained and that a heatsink apparatus having an excellent heat absorption performance is achieved by selecting an appropriate slit density, the heatsink apparatus ensuring a sufficient vaporization area and preventing temperature increase at an initial stage of heating.

Figure 12A:
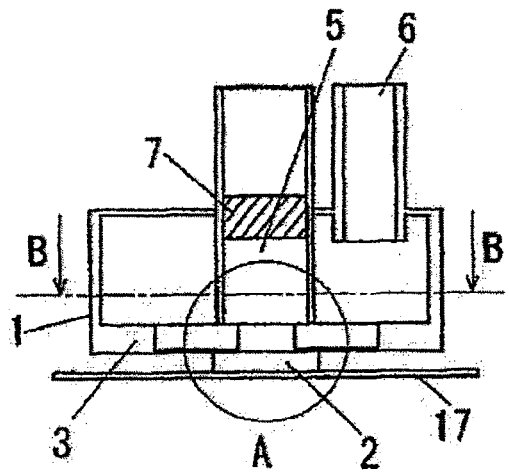
FIG. 12A is a central vertical cross-sectional view of an alternative heat-receiving unit according to the fourth embodiment of the present invention.
Figure 12C:
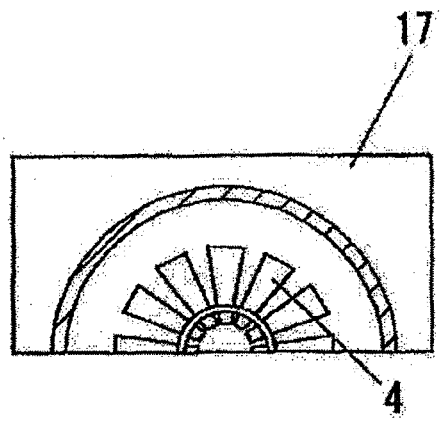
FIG. 12C is a horizontal cross-sectional view of the heat-receiving unit.
Figure 12B:
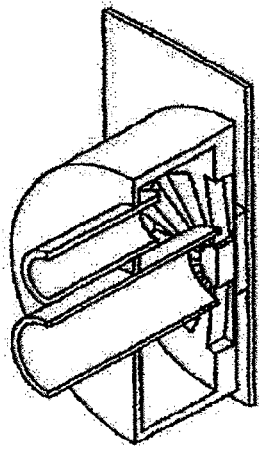
FIG. 12B is a cross-sectional perspective view of the heat-receiving unit.
Figure 12D:
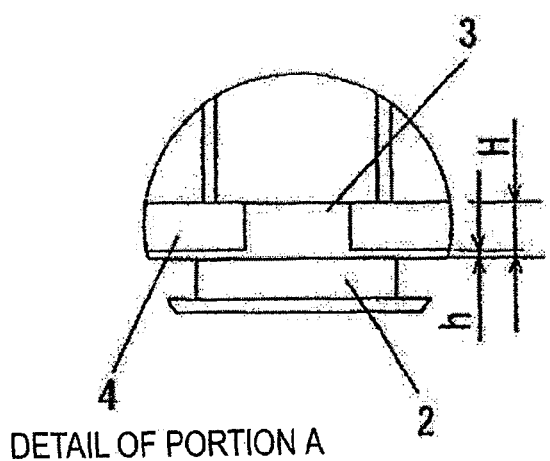
FIG. 12D is a cross-sectional detail view of a slit section at portion A.

A case where slits 4 are provided radially is explained next with reference to FIGS. 12A to 12D. FIG. 12A is a central vertical cross-sectional view of alternative heat-receiving unit 1 according to the fourth embodiment of the present invention; FIG. 12B is a cross-sectional perspective view of the heat-receiving unit of FIG. 12A; FIG. 12C is a horizontal cross-sectional view of the heat-receiving unit of FIG. 12A; and FIG. 12D is a cross-sectional detail view of a slit section at portion A shown in FIG. 12A. As shown in FIG. 12A, slits 4, which are provided in heat-receiving plate 3 of heat-receiving unit 1 immediately above heat-generating body 2, are provided radially so as to avoid a portion immediately above heat-generating body 2, similar to the case of FIGS. 10A to 10D. Similar to the case of FIGS. 1A to 11D, a width of slits 4 immediately below inlet pipe 5, where working fluid 14 flows in, is gradually wider as the slits extend away from the center of heat-generating body 2. Similar to the case of FIGS. 11A to 11D, an effect of employing the structure is not only enhancement of the above-described bubble detachment, but also maintenance of a required mechanical strength, and achievement of a heatsink apparatus having an excellent heat absorption performance with selection of an appropriate slit density, the heatsink apparatus ensuring a sufficient vaporization area and preventing temperature increase at an initial stage of heating.

In addition, when slits 4 are provided radially, more slits can be provided compared to parallel arrangement. Thereby, a heat-receiving area can be increased, and performance of the heatsink apparatus can further be enhanced.

In the present embodiment slits 4 are not provided at a central portion of heat-receiving plate 3 contacting with heat-generating body 2. It is possible, however, to provide slits 4 thereto.

Fifth Embodiment

In a fifth embodiment, a groove having a same size as an external circumference of an opening of inlet pipe 5 is provided on heat-receiving plate 3 such that the groove intersects with slits 4, and the opening of inlet pipe 5 is inserted into heat-receiving plate 3. The fifth embodiment is for using heat-receiving plate 3 in an upright position. For explanation purposes, identical reference numerals are provided to components identical to those in the first to fourth embodiments, and specific explanations thereof in the first to fourth embodiments are referred to.

Figure 13A:
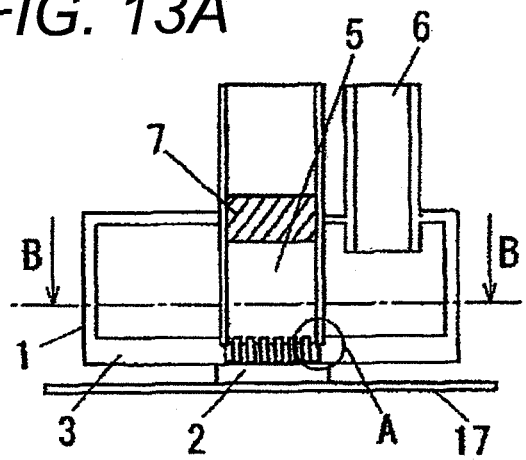
FIG. 13A is a central vertical cross-sectional view of an alternative heat-receiving unit according to a fifth embodiment of the present invention.
Figure 13B:
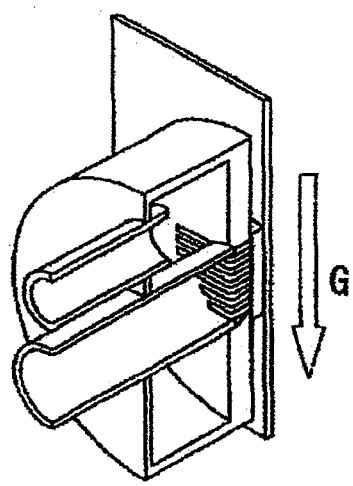
FIG. 13B is a cross-sectional perspective view of the heat-receiving unit.
Figure 13C:
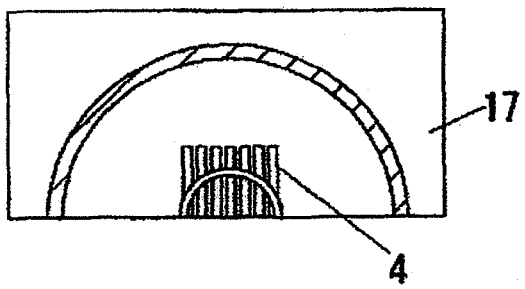
FIG. 13C is a horizontal cross-sectional view of the heat-receiving unit.
Figure 13D:
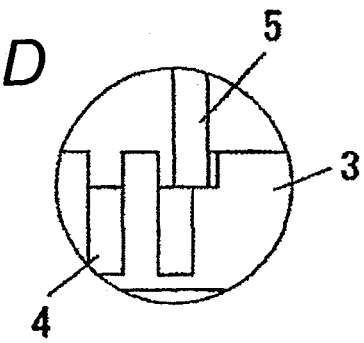
FIG. 13D is a cross-sectional detail view of a slit section at portion A.

FIG. 13A is a central vertical cross-sectional view of a heat-receiving unit according to the fifth embodiment of the present invention; FIG. 13B is a cross-sectional perspective view of the heat-receiving unit of FIG. 13A; FIG. 13C is a horizontal cross-sectional view of the heat-receiving unit of FIG. 13A; and FIG. 13D is a cross-sectional detail view of a slit section at portion A shown in FIG. 13A. FIG. 13A shows entire heat-receiving unit 1.

As shown in FIG. 13D, an end portion of inlet pipe 5 is slightly inserted into heat-receiving plate 3. The structure ensures that a working fluid supplied from inlet pipe 5 is surely directed to slits 4 without leaking in a direction of gravity, even when heat-receiving unit 1 is positioned as shown in the cross-sectional perspective view of FIG. 13B. Thereby, a positioning direction of heat-receiving unit 1 is more flexible ranging from horizontal to vertical, thus achieving a heatsink apparatus for electronic components that enhances possibility of versatile use.

Heat-receiving unit 1 can be provided vertically for operation also in the first to fourth embodiments. For vertical positioning of heat-receiving unit 1, however, it is preferable to provide inlet pipe 5 inserted into heat-receiving plate 3, as described above.

A case where the opening of the inlet pipe does not come in contact is explained below.

Sixth Embodiment

Figure 14:
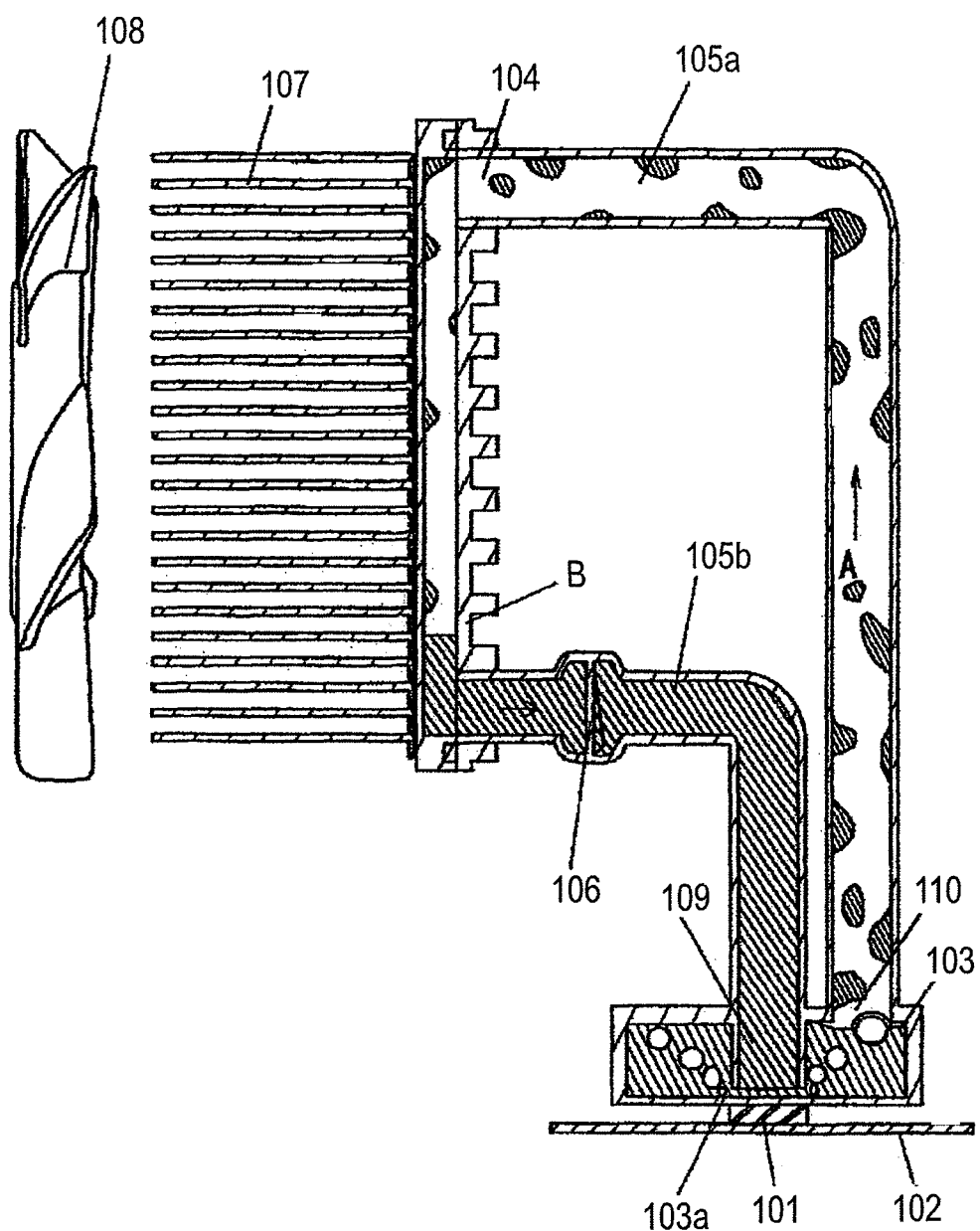
FIG. 14 is a cross-sectional view illustrating a structure when a heatsink apparatus according to a sixth embodiment of the present invention is provided in a PC unit.

FIG. 14 is a cross-sectional view illustrating a structure when a heatsink apparatus according to a sixth embodiment of the present invention is provided in a PC unit.

In FIG. 14, a direction of gravity is downward. MPU 101 is mounted on motherboard 102 along with other PC components not shown in the drawing. The heatsink apparatus of the present invention is provided in contact with MPU 101. The heatsink apparatus of the present invention includes heat receiver 103; heat dissipater 104; pipeline 105a, which circulates a working fluid and vapor thereof from heat receiver 103 to heat dissipater 104; pipeline 105b, which circulates the working fluid from heat dissipater 104 to heat receiver 103; and check valve 106, which is provided on a way of pipeline 105b to prevent backflow of the working fluid from heat receiver 103.

The heatsink apparatus also includes heat-receiving surface 103a, working fluid inlet 109, and vapor outlet 110. Heat-receiving surface 103a is provided to heat receiver 103, and is a surface on which MPU 101 is provided. Working fluid inlet 109 is an opening of pipeline 105b on a heat receiver 103 side, and is provided proximate to heat-receiving surface 103a. Working fluid inlet 109 supplies the working fluid. Vapor outlet 110 guides vapor generated inside heat receiver 103 to pipeline 105a.

A circulation system related to above-described pipeline 105a and pipeline 105b is referred to as a loop heat pipe. The loop heat pipe is filled with an appropriate amount of working fluid in a substantially vacuumed state by a vacuum pump and the like. A portion of the working fluid vaporizes at this time, when gas-liquid equilibrium is attained at a temperature inside the loop heat pipe.

Purified water is generally used as the working fluid. In order to enhance performance, ethyl alcohol and the like may be added.

A wetted portion inside the apparatus is required to be corrosion resistant in a high-vacuum state with purified water. Further, when a non-condensed gas exists in the system, most of the gas accumulates in heat dissipater 104, and thus molecule concentration of the non-condensed gas increases therein. As a result, molecule concentration of the working fluid existing in a form of vapor is relatively lowered. Thereby, a frequency of contact of the working fluid with the internal wall of heat dissipater 104 is reduced and condensation is eventually hindered. It is thus desirable to use for the wetted portion, material that does not generate a non-condensed gas even when the material is in a vacuum state at a relatively high temperature for a long duration. When purified water is used as the working fluid, copper is generally used since the material has an excellent heat conductivity.

Some plastic components may be used, such as, for example, fluorine plastics represented by PTFE (polytetrafluoroethylene). A plastic component having a wetted portion thinly coated with copper and the like can also be used.

Numerous heat-dissipating fins 107 are provided on an external portion of heat dissipater 104. A flow of external air fed from rotating fan 108 is blown to heat-dissipating fins 107.

A cooling process according to the present invention is explained below. A working fluid having a low temperature is first supplied from working fluid inlet 109. The working fluid vaporizes on heated heat-receiving surface 103 immediately above MPU 101 in heat receiver 103 and absorbs latent heat of vaporization. According to the structure, the low temperature working fluid is supplied to a location having a minimum distance between heat-receiving surface 103a and MPU 101. Thereby, thermal resistance of the location is minimized.

At this time, a fluid level of the working fluid is higher than heat-receiving surface 103a, specifically at a location indicated with arrow B proximate to the lowest portion of a hollow section in heat dissipater 104, as shown in FIG. 14. Thus, a pressure of water head difference from the fluid level of the working fluid to working fluid inlet 109 causes the working fluid staying on heat-receiving surface 103a to flow. More specifically, the working fluid on heat-receiving surface 103a contacts therewith while being constantly replaced, and a portion of the working fluid that reaches a boiling point or higher vaporizes and turns into vapor. Heat from MPU 101 is transferred to an entire area of heat-receiving surface 103a, on which heat transfer to the working fluid occurs on the entire area thereof.

In FIG. 14, the generated vapor travels upward in the working fluid in a form of bubbles. Then, the vapor stays in a space in heat receiver 103; or passes through vapor outlet 110, directly enters pipeline 105a directed from heat receiver 103 to heat dissipater 104, and moves upward in a direction of arrow A. Vaporization changes the working fluid into a gas. Volume fluctuation associated with the change is significant. When 0.1 gram of purified water is vaporized in a heat pipe having an equilibrium of 10 k Pa, for instance, a volume ratio is eventually about 15,000 times based on a simple calculation.

The volume fluctuation, however, does not occur exponentially from a micro point of view. The volume gradually changes in such a state that dynamic equilibrium around bubble nuclei formed on heat-receiving surface 103a is maintained, and vapor bubbles form accordingly. Thus, the volume fluctuation does not occur explosively. In addition, heat exchange with the surrounding working fluid condenses the volume to some extent. Thus, the volume ratio does not reach the above-described value, and results in around several hundreds of times. Concurrently, condensation from vapor to liquid occurs on the wall surface of the hollow section provided inside heat dissipater 104, thereby causing a sharp volume reduction, opposite to vaporization, in heat receiver 103.

Accordingly, a pressure difference is generated between heat receiver 103 and heat dissipater 104, although the components are linked via pipeline 105a. The pressure difference transfers vapor at a high velocity from heat receiver 103 to heat dissipater 104. The vapor flow moves the working fluid around vapor outlet 110 into vapor outlet 110 as a mixture of vapor and working fluid.

Thereafter, the working fluid travels toward heat dissipater 104 in pipeline 105a urged by the vapor flow, as shown in FIG. 14. In the present invention, in order not to disturb the flow of the working fluid and vapor that circulate so as to secure a large circulation amount, pipeline 105a is provided with a diameter not filled and closed by a surface tension of the working fluid. Thus, the working fluid is pushed to flow in drops, or in a wave form on the pipe wall, and then transferred through pipeline 105a to heat dissipater 104 in a gas-liquid two-layer flow.

Thereby, the amount of working fluid circulating in the heatsink apparatus increases, and thus the heat-receiving amount of the heatsink apparatus increases.

The circulation amount of the working fluid is limited in a heatsink apparatus having a conventional loop heat pipe system, however, in which the working fluid is transferred by a capillary action of a wick. Thus, it is difficult to increase the heat-receiving amount of the heatsink apparatus.

In order to increase the working fluid circulating in the heatsink apparatus so as to increase the heat-receiving amount of the heatsink apparatus, the heatsink apparatus needs a pump, a sensor, a valve, and the like.

Unlike the conventional heatsink apparatus, the present invention does not require such a pump, a sensor, a valve, and the like. Instead, the present invention transfers the working fluid in a gas-liquid two-layer flow so as to increase the amount of the working fluid circulating in the heatsink apparatus and stably supply the working fluid to heat-receiving surface 103a, thereby increasing the heat-receiving amount of the heatsink apparatus.

The pressure difference is generated between heat receiver 103 and heat dissipater 104 in accordance with condensation of vapor in heat dissipater 104, as described above. Since check valve 106 prevents backflow, however, hardly any vapor in heat receiver 103 escapes from working fluid inlet 109.

The vapor that enters heat dissipater 104 from pipeline 105a is cooled when the vapor comes in contact with the internal wall, which is cooled by external fan 108 and heat-dissipating fins 107. The vapor then condenses on the wall surface, as shown in FIG. 14, and dissipates heat thereto.

The volume ratio of the working fluid before and after the condensation is high, as described above. Since the volume fluctuates rapidly at the time of condensation, the vapor travels at a significantly high velocity from heat receiver 103 to heat dissipater 104 through pipeline 105a.

As described above, the heat from the wall surface is transferred to heat dissipating fins 107 and then dissipated to an external air flow. The working fluid, which condenses and returns to liquid, accumulates at the lowest portion of heat dissipater 104, and flows out to heat receiver 103 therefrom.

The condensed working fluid is also cooled throughout the time when the working fluid deposits on the internal wall of heat dissipater 104 and stays in heat dissipater 104. Thus, the working fluid has a lower temperature than the equilibrium temperature in the system, and thereby flows in from heat dissipater 104 to heat receiver 103 through pipeline 105b.

Through the steps above, the heat generated by the operation of MPU 101 is eventually dissipated into air according to vaporization and condensation of the working fluid.

Figure 15:
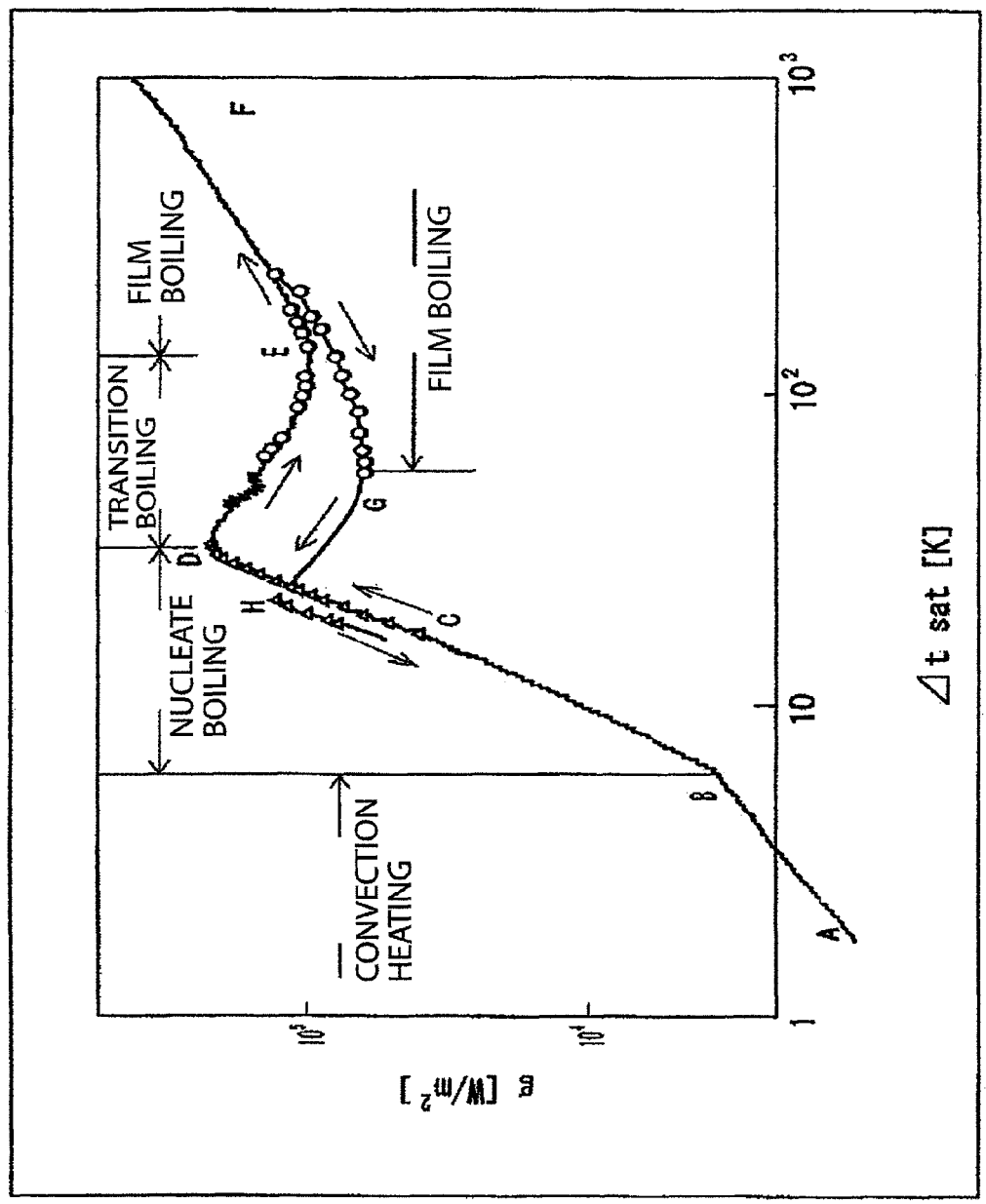
FIG. 15 illustrates heat transfer performance in general boiling modes.

Heat transfer performance according to boiling modes is explained below with reference to FIG. 15. FIG. 15 illustrates heat transfer performance in general boiling modes.

The heat transfer performance (an amount of heat transfer per unit area; $W/m^2$), which is equivalent to a heat absorption property in the present embodiment, increases in proportion to a temperature difference between heat-receiving surface 103a and the working fluid in a nucleate boiling range (from B to D in FIG. 15), and peaks at a point of transition from the nucleate boiling range to a transition boiling range (D in FIG. 15). Although the heat transfer performance declines to some extent up to a point of transition from the transition boiling range to a film boiling range (E in FIG. 15), a high heat transfer performance is demonstrated, compared to a convection heating range (from A to B in FIG. 15) and the nucleate boiling range (from B to D in FIG. 15). In order to retain the temperature of heat-receiving surface 103a low within a predetermined range and maintain the high heat transfer performance, it is ideal to maintain the nucleate boiling range before the transition boiling range. Specifically, high performance is achieved when an apparatus is provided with a structure in which a low temperature working fluid continuously flows immediately proximate to overheated heat-receiving surface 103a and formed vapor bubbles are moved from heat-receiving surface 103a while being small, so as to prevent the bubbles from growing together or turning into a film shape.

When the above-described MPU having a high heat density is cooled, in particular, heat-receiving surface 103a is generally overheated more than the vaporization temperature in the loop heat pipe. Thus, vaporization therein is significant, and the boiling mode is possibly close to the film boiling range. According to the present invention, however, the working fluid is supplied constantly and stably to heat-receiving surface 103a. Thereby, complete transition to the film boiling mode can be prevented until the heat density of heat-receiving surface 103a reaches very high, and thus the performance of the apparatus can be enhanced.

A relation between the opening of working fluid inlet 109 and heat-receiving surface 103a is explained below with reference to FIGS. 16A to 18B.

Figure 16A:
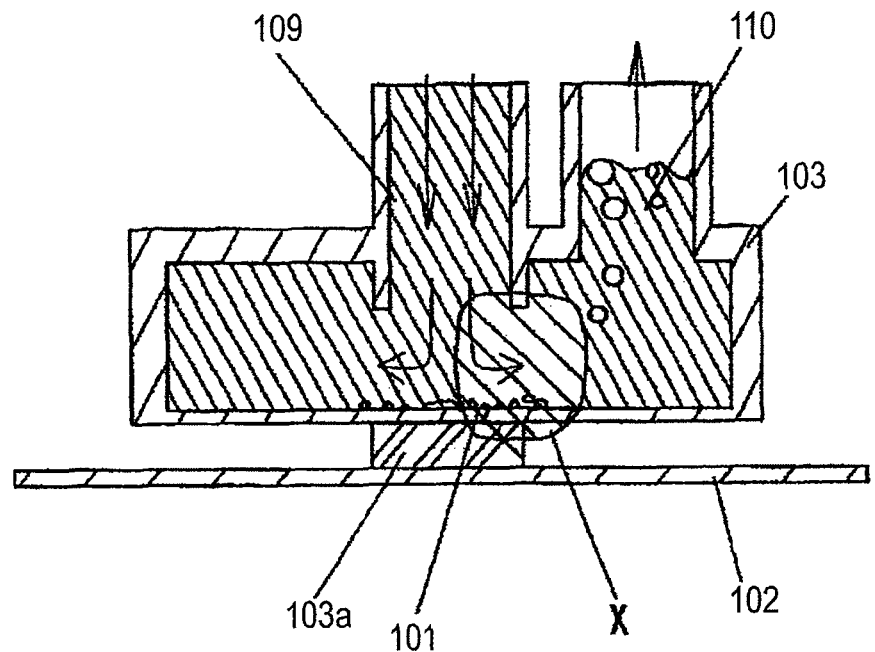
FIG. 16A is a cross-sectional view illustrating an initial operation status of a heat receiver of a heatsink apparatus, not according to the sixth embodiment of the present invention.
Figure 16B:
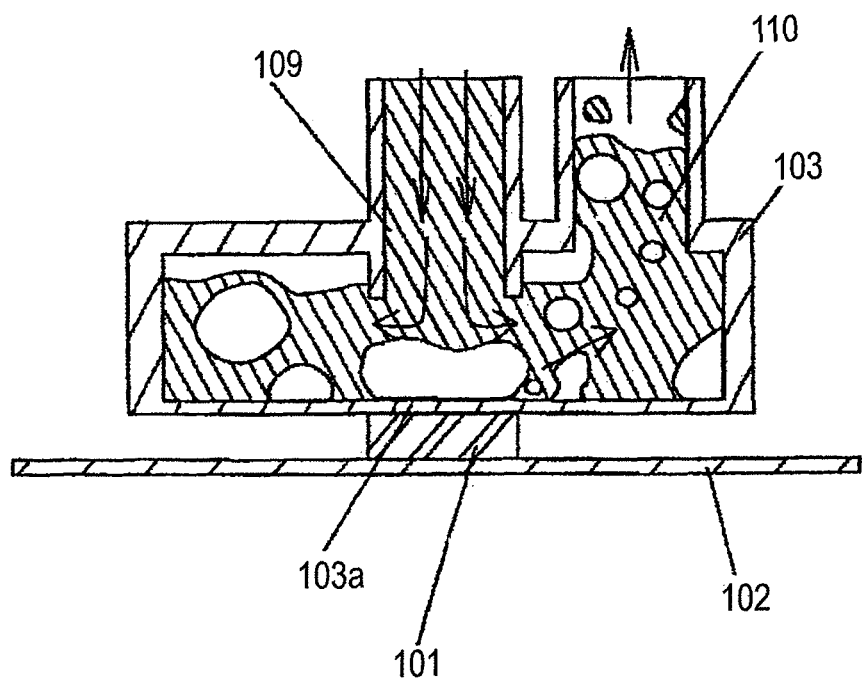
FIG. 16B is a cross-sectional view illustrating a stationary operation status of the heat receiver of the heatsink apparatus, not according to the sixth embodiment of the present invention.

FIGS. 16A and 16B are a conventional example, in which an opening of working fluid inlet 109 and heat-receiving surface 103a are provided apart different from the present invention. FIG. 16A is a cross-sectional view illustrating an initial operation status of a heat receiver of a heatsink apparatus, not according to the sixth embodiment of the present invention; and FIG. 16B is a cross-sectional view illustrating a stationary operation status of the heat receiver of the heatsink apparatus, not according to the sixth embodiment of the present invention;

In FIG. 16A, a working fluid flows into a hollow section in heat receiver 103 from the opening of working fluid inlet 109. Since an inflow area is wide and inflow velocity is low, the working fluid immediately spreads out as shown with arrows. Thus, no flow along heat-receiving surface 103a is generated proximate thereto, and a majority of the working fluid is discharged, along with formed bubbles, from vapor outlet 110 to outside of heat receiver 103. As a result, the flow stagnates proximate to heat-receiving surface 103a, and vapor bubbles formed on heat-receiving surface 103a deposit thereon and tend to expand.

As time elapses thereafter, the vapor bubbles formed on heat-receiving surface 103a are combined with adjacent bubbles, as shown in FIG. 16B, thus resulting in the above-described film boiling mode, in which film-shaped vapor deposits on the wall space and does not move frequently, on heat-receiving surface 103a. The vapor film on heat-receiving surface 103a vibrates due to a flow of the surrounding working fluid and a fluctuation of vapor pressure inside the film. Accordingly, when a portion of h-eat-receiving surface 103a within the vapor film comes in contact with the working fluid, a small amount of vapor is newly generated on the portion. In other words, vapor is not mainly generated on a portion immediately above MPU 101, but on a surrounding area thereof having a low temperature.

In addition, since the vapor itself has a low heat transfer coefficient, the vapor prevents temperature increase of the surrounding working fluid by convection heating in vapor bubbles. Consequently, the above-described issues adversely impact the heat absorption property, represented as thermal resistance, of heat-receiving surface 103a. Since the thermal resistance is high in this state, the temperature of MPU 101 remains high. For stable operation of a PC, it is required to reduce an amount of generated heat so as to reduce the temperature. Accordingly, a countermeasure is required, such as to lower a processing capacity of MPU 101, thus causing a problem.

Figure 17:
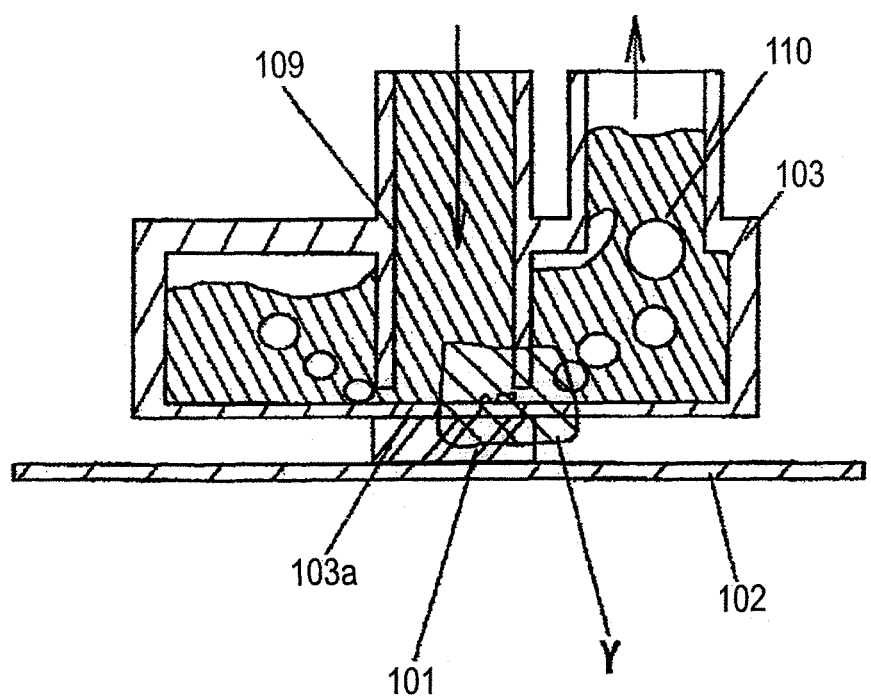
FIG. 17 is a cross-sectional view illustrating an operation status of the heat receiver of the heatsink apparatus according to the sixth embodiment of the present invention.

In order to address the problem as shown in FIG. 17, a gap between the opening of working fluid outlet 109 and heat-receiving surface 103a is provided narrow and close to each other in the present invention, thereby preventing the above-described transition to the film boiling mode. The structure allows the working fluid, which is cooled in heat dissipater 104, to maintain the cool temperature, and to be transferred proximate to the heat-receiving surface 103a while receiving a certain amount of pressure. Thereby, a flow along heat-receiving surface 103a occurs proximate thereto, and thus the low temperature working fluid constantly flows proximate to heat-receiving surface 103a. Formed vapor bubbles can be moved from heat-receiving surface 103a while the bubbles are small, in order to prevent the bubbles from growing together or from turning into a film shape.

Figure 18A:
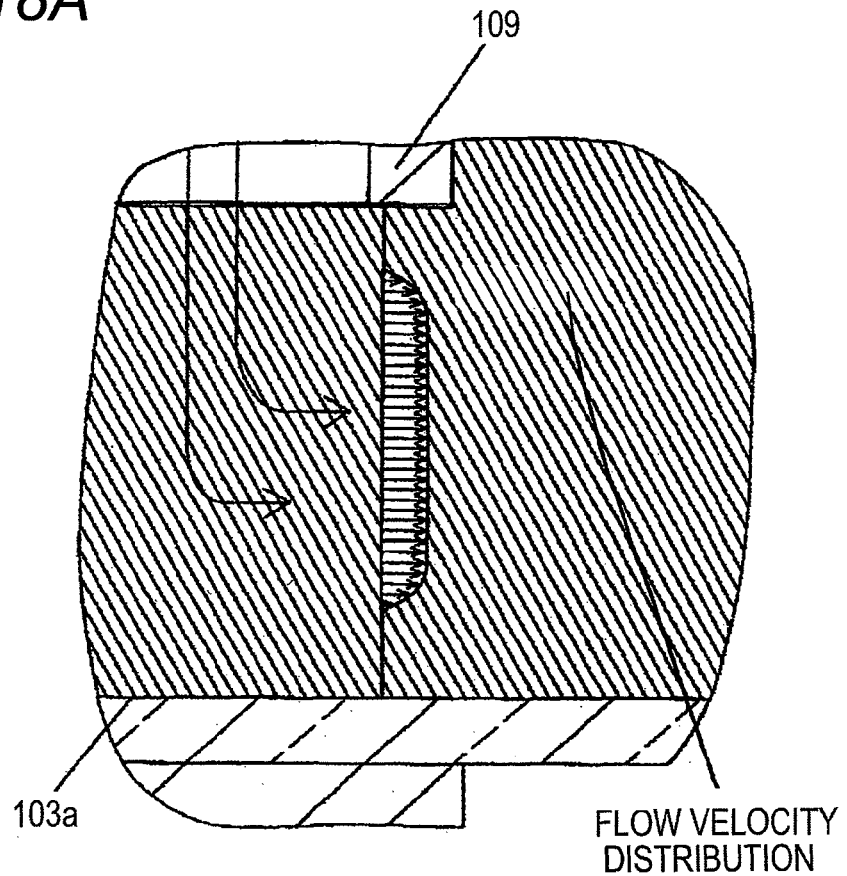
FIG. 18A is a schematic view illustrating a behavior of a working fluid and vapor bubbles proximate to a heat-receiving surface, not according to the sixth embodiment of the present invention.
Figure 18B:
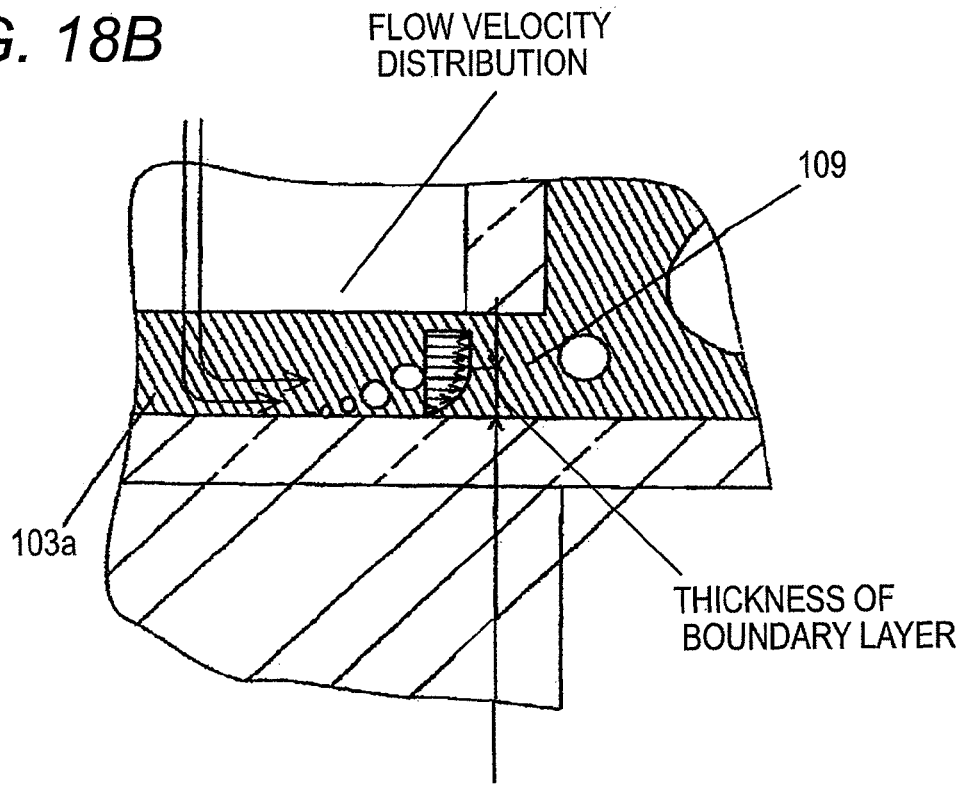
FIG. 18B is a schematic view illustrating a behavior of a working fluid and vapor bubbles proximate to a heat-receiving surface of the heatsink apparatus according to the sixth embodiment of the present invention.

Behaviors of a working fluid and vapor bubbles proximate to heat-receiving surface 103a of the heatsink apparatus and of a conventional heatsink apparatus are illustrated in FIGS. 18A and 18B. FIG. 18A is a schematic view illustrating a behavior of a working fluid and vapor bubbles proximate to the heat-receiving surface, not according to the sixth embodiment of the present invention; and FIG. 18B is a schematic view illustrating a behavior of a working fluid and vapor bubbles proximate to the heat-receiving surface of the heatsink apparatus according to the sixth embodiment of the present invention.

In the conventional heatsink apparatus, the working fluid flowing in from working fluid inlet 109 does not reach proximate to heat-receiving surface 103a, but flows in a portion away from heat-receiving surface 103a, as shown in FIG. 18A.

Thus, velocity of the working fluid is substantially 0 proximate to the heat-receiving surface 103a. Since the flow of the working fluid flowing in from working fluid inlet 109 cannot flush out the working fluid on heat-receiving surface 103a, the working fluid stagnates on heat-receiving surface 103a, and lumps of bubbles form on heat-receiving surface 103a, as shown in FIG. 16B. The bubbles hinder vaporization, thus exacerbating heat absorption performance of heat-receiving surface 103a.

In contrast, since working fluid inlet 109 is provided proximate to heat-receiving surface 103a in the heatsink apparatus of the present invention, as shown in 18B, the working fluid flowing in from working fluid inlet 109 flows proximate to heat-receiving surface 103a.

Thus, the velocity of the working fluid is not 0 proximate to heat-receiving surface 103a, and the flow of the working fluid flowing in from working fluid inlet 109 causes the working fluid stagnating on heat-receiving surface 103a to flow. Thereby, vapor bubbles of the working fluid forming on heat-receiving surface 103a do not stagnate, and do not hinder vaporization of the working fluid, thus enhancing the heat absorption performance of heat-receiving surface 103a.

Specifically, in FIG. 18B, the working fluid flows in from working fluid inlet 109 perpendicular to heat-receiving surface 103a. Then, the working fluid changes its direction of flow so as to be along heat-receiving surface 103a, and flows to a gap between heat-receiving surface 103a and working fluid inlet 109. In the flow along heat-receiving surface 103a, a boundary layer exists proximate to heat-receiving surface 103a due to viscosity of the working fluid. A velocity distribution in the boundary layer is as shown in the drawing. The velocity is substantially 0 on the wall surface, where heat-receiving surface 103a directly transfers heat to the working fluid. The working fluid exceeding a boiling point, which is determined by a pressure threat, vaporizes and forms vapor bubbles. Vaporization draws a large amount of latent heat from surrounding heat-receiving surface 103a and working fluid, thereby achieving a significantly high heat transfer ratio compared to convection heating. Immediately after formation, a volume of vapor bubbles gradually expands due to its internal pressure. When the bubbles grow sufficiently large relative to a thickness of the above-described boundary layer, the bubbles receive a shear force caused by a velocity difference within the boundary layer, and concurrently detach from heat-receiving surface 103a to be released into the working fluid. Further, the flow of the constantly supplied working fluid immediately flushes out the formed vapor bubbles from heat-receiving surface 103a.

In addition, even when the heat density is high and the temperature of heat-receiving surface 103a is high, the structure allows a low temperature working fluid to contact with heat-receiving surface 103a efficiently. Thus, the working fluid absorbs heat even by convection heating from heat-receiving surface 103a and formed vapor bubbles, even when the heat density on heat-receiving surface 103a is high. Thereby, vaporization continues in a range before fern boiling in the boiling mode, thus achieving a good heat absorption property, as described above. A gap wider than the provided gap changes a flow field. Thus, the flow of the working fluid is in a state close to shown in FIG. 16A, where the working fluid does not move proximate to heat-receiving surface 103a and significantly stagnates at the opening of working fluid inlet 109. As a result, the temperature of the working fluid proximate to heat-receiving surface 103a rises because of heat transfer from heat-receiving surface 103a, as described above. Although the working fluid vaporizes little by little, the working fluid is not replaced. Since expanded bubbles cover heat-receiving surface 103a, the working fluid cannot come in contact with heat-receiving surface 103a. Consequently, vaporization is difficult to occur no more.

Further, it is preferable to provide the opening in parallel with heat-receiving surface 103a. In the structure, the working fluid flows in perpendicular to heat-receiving surface 103a, and thereafter the working fluid changes the direction of flow so as to be along heat-receiving surface 103a, as described above. Since the flow field of the working fluid flowing to the gap between heat-receiving surface 103a and working fluid inlet 109 is extremely close to axial symmetry, formed bubbles evenly flow out without causing stagnation. When one side of the opening is extremely apart, the flow of the working fluid is significantly uneven, thus leading to unevenness in formed bubbles, and causing a local stagnation. Thereby, the performance declines. When the flow of the working fluid is approximately axis symmetric with respect to a normal line passing a face center of heat-receiving surface 103a, however, the opening does not need to have a planer shape in parallel with heat-receiving surface 103a. For example, an opening may have a notch having a point symmetrical shape with respect to the opening center.

Figure 19:
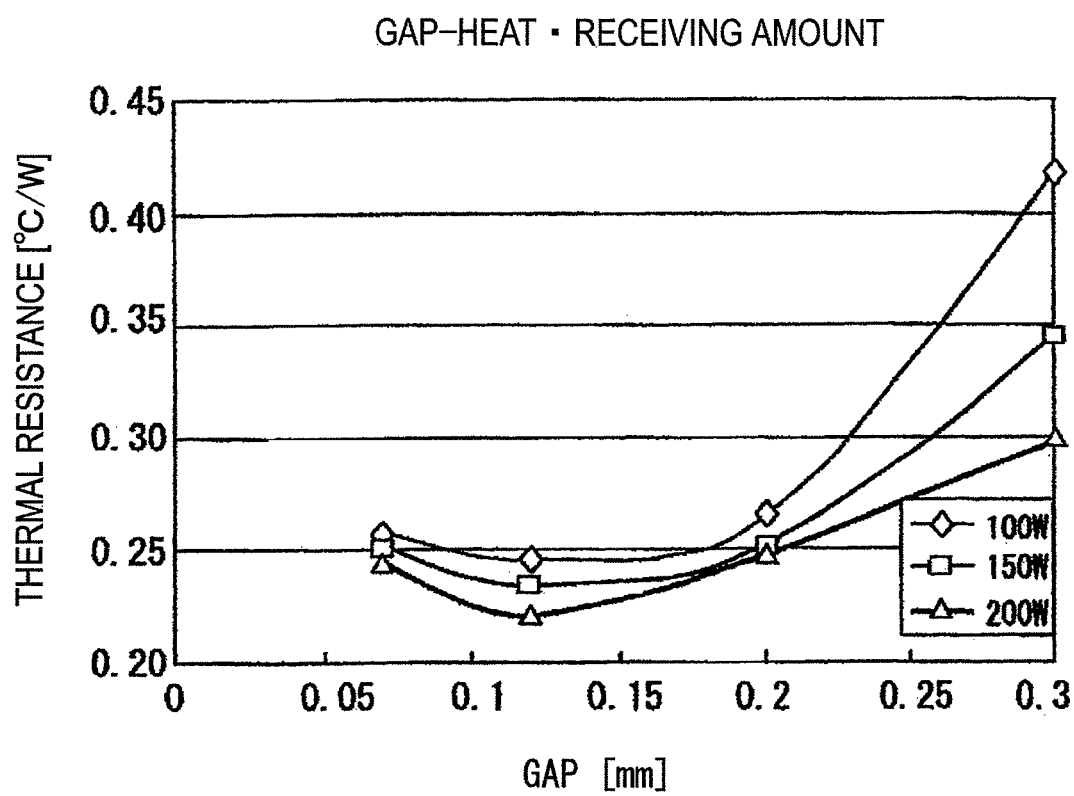
FIG. 19 is a chart illustrating a relation between a gap with the heat-receiving surface and a heat-receiving amount obtained from an experiment.

In the present embodiment, working fluid inlet 109 and heat-receiving surface 103a are provided promote to each other so that the flow of the working fluid flushes out vapor bubbles formed on heat-receiving surface 103a A relation of the gap between working fluid inlet 109 and heat-receiving surface 103a and thermal resistance of heat receiver 103 is shown in FIG. 19.

It is demonstrated in FIG. 19 that the thermal resistance is low when a gap is around 0.1 mm, and is high when the gap is less or greater than that. Further, when the gap is 0.2 mm or greater, the thermal resistance sharply aggravates. This is because, as described above, when the gap is 0.2 mm or greater, the supplied working fluid having a low temperature is not provided on heat-receiving surface 103a due to the above-described reasons. Particularly when the heat density is high of heat-receiving surface 103a receiving a large amount of heat, the working fluid is in the film boiling mode.

According to a condition of the present invention, a thickness of the boundary layer is about 0.07 mm. When the gap with heat-receiving surface 103a is less than 0.07 mm, which is substantially the same as the thickness of the boundary layer, fluid resistance between the opening and heat-receiving surface 103a is high, and a flow rate of the working fluid declines. Thus, an amount of heat drawn from heat-receiving surface 103a by convection heating declines, and concurrently formed vapor bubbles are not smoothly discharged, thereby causing a tendency to increase the thermal resistance. Accordingly, in view of enhancement of cooling performance and stability, an effective gap between working fluid inlet 109 and heat-receiving surface 103a is between 0.07 mm and 0.2 mm.

In other words, when the gap between working fluid inlet 109 and heat-receiving surface 103a is within a range of about three times or less the thickness of the working fluid boundary layer of 0.07 mm, the cooling performance and stability are enhanced.

Since the opening of working fluid inlet 109 is provided proximate to heat-receiving surface 103a in the present invention, a surface tension of the working fluid forms a water film between the opening and heat-receiving surface 103a, thus preventing externally formed vapor bubbles from flowing into working fluid inlet 109. Thereby, the working fluid can be supplied more stably to heat-receiving surface 103a.

The above-described effect is obtained by providing heat-receiving surface 103a proximate to a surface opposite thereto in heat receiver 103 so as to provide thin heat receiver 103, and by narrowing a gap between working fluid inlet 109 and heat-receiving surface 103a. In the present invention, however, working fluid inlet 109 is provided inside heat receiver 103.

Thereby, working fluid inlet 109 is proximate to heat receiver 103 regardless of the structure of heat receiver 103, and thus heat receiver 103 can have a large internal volume while working fluid inlet 109 is provided proximate to the internal wall. Thus, the amount of the working fluid in the heatsink apparatus can be increased, accordingly preventing the working fluid from disappearing from the heat receiver even when a fluctuation in heat amount of the heat-generating body is large. As a result, even when a heat-generating body having a large fluctuation of heat amount is cooled, the heat absorption property of the heat receiver is improved, and thus the performance of the heatsink apparatus can be enhanced.

Seventh Embodiment

A measure for further improving heat absorption property is explained below with reference to FIGS. 20A and 20B. For explanation purposes, identical reference numerals are provided in FIGS. 20A and 20B to components identical to those in the sixth embodiment, and specific explanations thereof in the sixth embodiment are referred to.

Figure 20A:
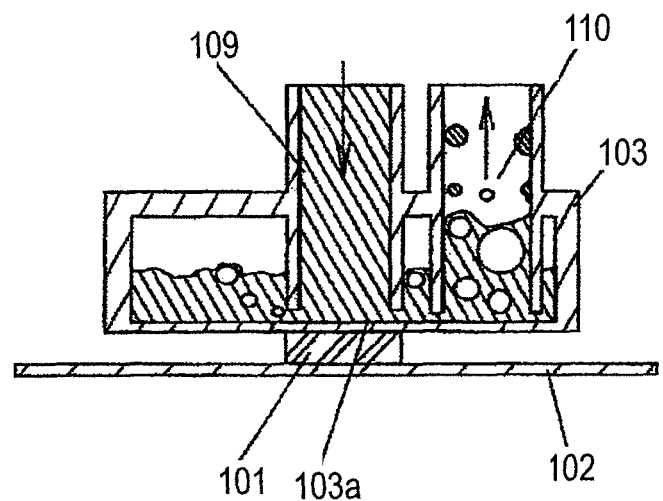
FIG. 20A is a cross-sectional view illustrating a heatsink apparatus before operation according to a seventh embodiment of the present invention.
Figure 20B:
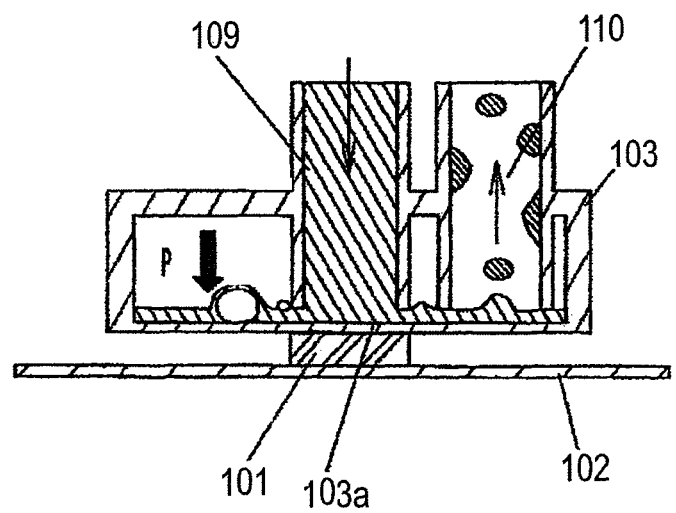
FIG. 20B illustrates operation of the heatsink apparatus according to the seventh embodiment of the present invention.

In FIGS. 20A and 20B, vapor outlet 110 is provided inside heat receiver 103 and proximate to heat-receiving surface 103a. FIG. 20A is a cross-sectional view illustrating a heatsink apparatus before operation according to a seventh embodiment of the present invention; and FIG. 20B illustrates operation of the heatsink apparatus according to the seventh embodiment of the present invention.

In FIG. 20A, when MPU 101 does not generate heat, a water level in heat receiver 103 is at a predetermined position. In this state, vapor outlet 110 is completely submerged in the water.

When MPU 101 starts generating heat, a working fluid starts vaporizing. Then, the vaporized working fluid is discharged from vapor outlet 110, and starts to accumulate in a space above heat receiver 103.

Then, the vaporized working fluid increases pressure P in heat receiver 103. Pressure P discharges the working fluid in heat receiver 103 from vapor outlet 110, along with vapor, and starts to push down the water level of the working fluid in heat receiver 103. When the state progresses, the amount of the working fluid in heat receiver 103 is reduced and vaporization of the working fluid is accelerated.

When the water level of the working fluid in heat receiver 103 is pushed down to a position of vapor outlet 110, in particular, vaporization of the working fluid is accelerated effectively while a thin layer of the working fluid is maintained on heat-receiving surface 103a.

Even when the water level of the working fluid is pushed down below vapor outlet 110, as the working fluid is vaporized, vapor inside heat receiver 103 alone is discharged from vapor outlet 110 by pressure P in heat receiver 103. Thus, pressure P in heat receiver 103 is lowered, and the water level pushed down by pressure P is elevated back to the position of vapor outlet 110.

Accordingly, when a certain period of time elapses since MPU 101 starts generating heat, pressure P and the water level of the working fluid in heat receiver 103 are substantially constant, and the water level of the working fluid in heat receiver 103 is stabilized in a state pushed down to the position of vapor outlet 110.

With the structure, when MPU 101 is provided below heat receiver 103, a vapor pressure of the working fluid vaporized by the heat from MPU 101 increases pressure P in heat receiver 103, as vapor outlet 110 is provided inside heat receiver 103. Thereby, the water level in heat receiver 103 is pushed down to vapor outlet 110, and an amount of the working fluid existing in heat receiver 103 is reduced to accelerate vaporization of the working fluid. Thus, the heat absorption property of heat receiver 103 can further be enhanced.

Further, even when the water level of the working fluid is below vapor outlet 110, vapor in heat receiver 103 is discharged from vapor outlet 110, and thereby pressure P in heat receiver 103 is lowered. Then, the water level pushed down by pressure P can be recovered to the position of vapor outlet 110, and the water level of the working fluid in heat receiver 103 is restored toward the position of vapor outlet 110. Thus, a state can be stably continued where vaporization of the working fluid is accelerated while a thin layer of the working fluid is maintained on heat-receiving surface 103a.

Specifically, a difference from FIG. 17 is that vapor outlet 110 is also provided proximate to heat-receiving surface 103a, similar to working fluid inlet 109, in FIG. 20B. Similar to the above description, the working fluid flowing in from working fluid inlet 109 comes in contact with heat-receiving surface 103a, increases its temperature, boils, and turns into vapor.

As described above, the vapor volume is large and the pressure difference is generated with respect to the heat dissipater. Thus, the flow velocity proximate to the opening of vapor outlet 110 is very high. With the structure shown in FIGS. 20A and 20B, the working fluid before boiling at the opening position of vapor outlet 110, is swiftly pushed out from the vapor outlet along with the vapor flow. Thereby, the fluid level of the working fluid in heat receiver 103 is maintained at substantially the same height as the opening position of vapor outlet 110. Accordingly, the working fluid does not stay thickly on heat-receiving surface 103a and a surrounding area thereof, and is constantly replaced while maintaining a thin layer shape.

Vapor bubbles formed on heat-receiving surface 103a in FIG. 17 move upward therefrom due to buoyancy. Accordingly, heat exchange occurs in a process in which the surrounding working fluid newly comes in contact with heat-receiving surface 103a, increases its temperature, and vaporizes. In heat receiver 103 shown in FIG. 20B, however, there is no process in which vapor moves upward in the working fluid. Instead, vapor is released into a space immediately above a water film proximate to heat-receiving surface 103a. Thereby, vapor bubbles are quickly discharged. In addition, the water film shortens a temperature increase time per unit area, thus generating more vapor.

In other words, pressure P of vapor generated on heat-receiving surface 103a pushes down the water level in heat receiver 103, and thereby accelerates vaporization of the working fluid on heat-receiving surface 103a.

A surface tension is generated concurrently at an interface of the working fluid with vapor spreading in a surrounding area. A thin water film portion, where vapor has been released, is promptly supplied with the working fluid from a thick water film portion surrounding the thin portion, thereby further efficiently generating vapor and thus achieving a good heat absorption property.

Eighth Embodiment

A case where heat-dissipating fins are provided in order to enhance a heat absorption property is explained with reference to FIG. 21. For explanation purposes, identical reference numerals are provided to components identical to those in the sixth embodiment, and specific explanations thereof in the sixth embodiment are referred to.

Figure 21:
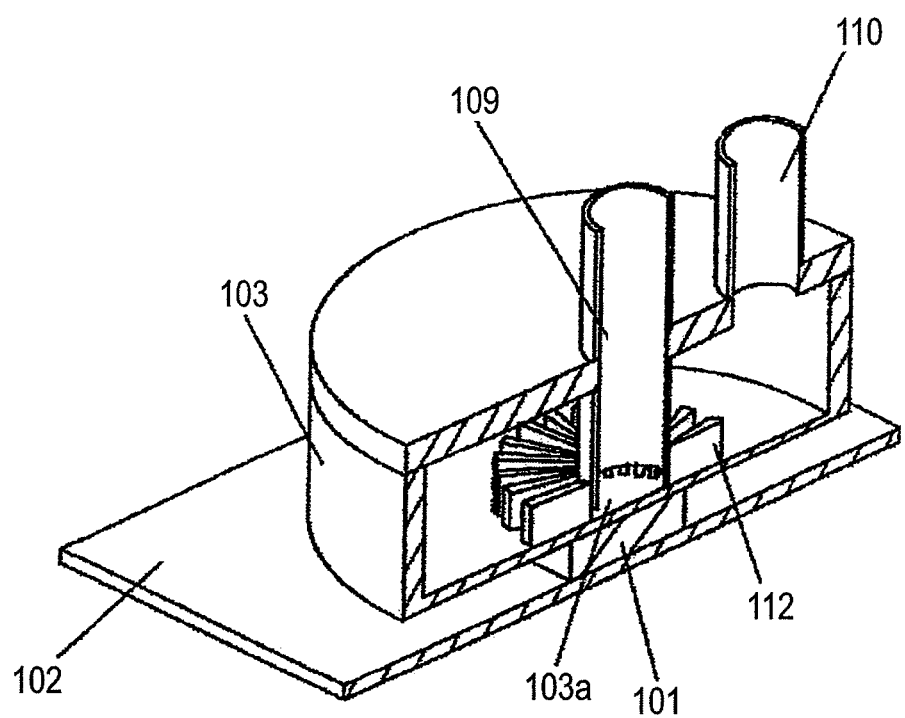
FIG. 21 is a cross-sectional perspective view illustrating an operation status of a heat receiver of a heatsink apparatus according to an eighth embodiment of the present invention.

FIG. 21 is a cross-sectional perspective view illustrating an operation status of a heat receiver of a heatsink apparatus according to an eighth embodiment of the present invention. In the present embodiment, fins 112 are provided substantially radially from a center axis of working fluid inlet 109, and fins 112 are integrally provided with heat-receiving surface 103a, such that end portions of the respective fins are provided on a circumference having the center axis of working fluid inlet 109 as the center.

Upper ends of fins 112 are provided with a sufficient space with a surface opposite to heat-receiving surface 103a in the heat receiver, so as not to prevent discharge of vapor even when generated between fins 112.

The structure allows heat-receiving surface 103a to have a large area within a range that does not prevent discharge of generated vapor, and to transfer a large amount of heat to a working fluid so as to generate as much vapor as possible, thereby enhancing the heat absorption performance. Although fins 112 are provided radially from working fluid inlet 109 in the present embodiment, the fin layout is not limited to the radial shape.

Ninth Embodiment

A case where annular vapor outlet 110 is provided around working fluid inlet 109 is explained with reference to FIGS. 22A and 22B. For explanation purposes, identical reference numerals are provided to components identical to those in the sixth embodiment, and specific explanations thereof in the sixth embodiment are referred to.

Figure 22A:
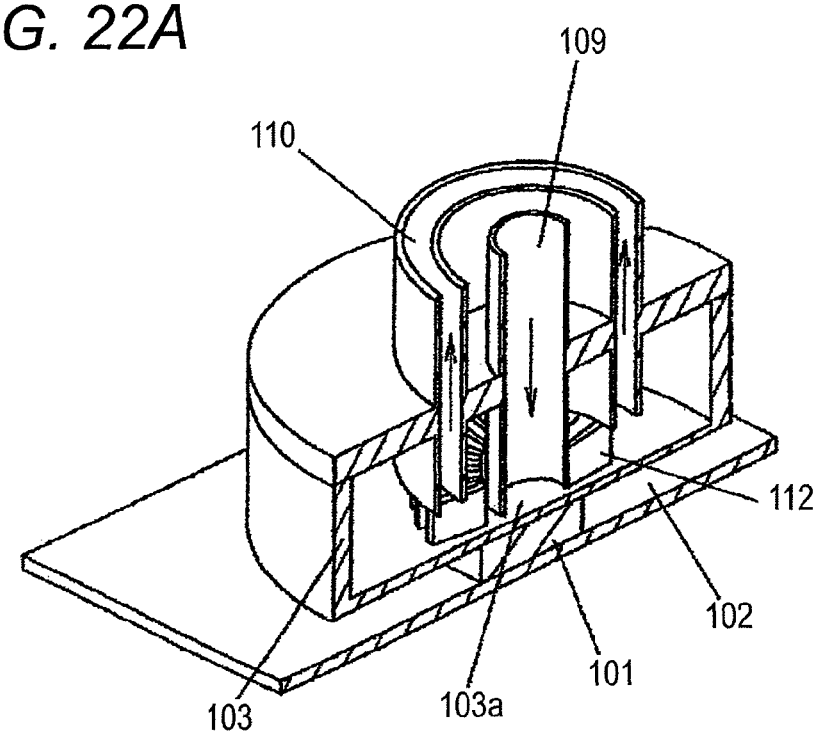
FIG. 22A is a cross-sectional perspective view illustrating a structure of a heat receiver of a heatsink apparatus according to a ninth embodiment of the present invention.
Figure 22B:
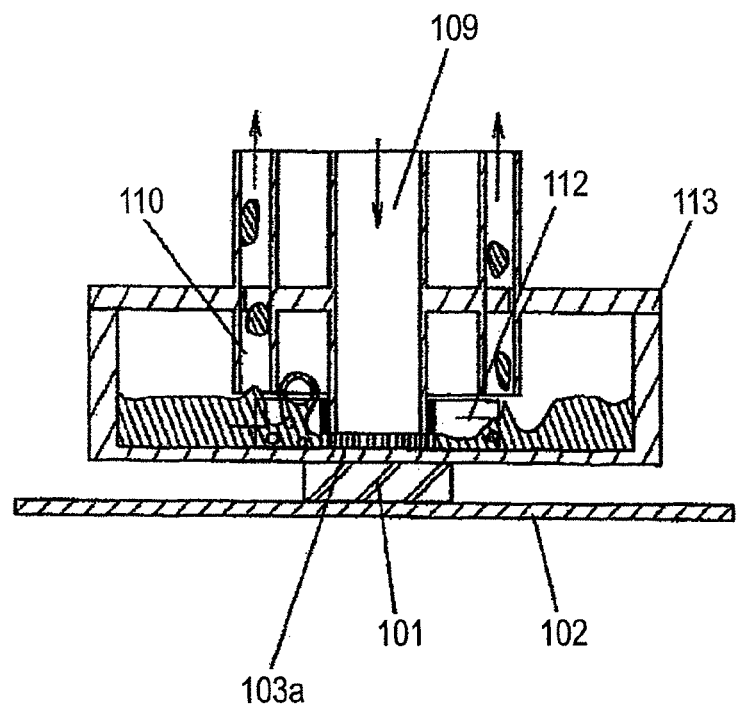
FIG. 22B is a conceptual diagram illustrating an operation status inside the heat receiver according to the ninth embodiment of the present invention.

FIG. 22A is a cross-sectional perspective view illustrating a structure of a heat receiver of a heatsink apparatus according to a ninth embodiment of the present invention; and FIG. 22B is a conceptual diagram illustrating an operation status inside the heat receiver according to the ninth embodiment of the present invention.

As shown in FIG. 22A, a structure is in common with the embodiment shown in FIG. 21, in that fins 112 are provided substantially radially from a center axis of working fluid inlet 109, and fins 112 are integrally provided with heat-receiving surface 103a, such that end portions of the respective fins are provided on a circumference having the center axis of working fluid inlet 109 as the center. The structure is also in common with the embodiment shown in FIG. 21, in that upper ends of fins 112 are provided with a sufficient space with a surface opposite to heat-receiving surface 103a in the heat receiver, so as not to prevent discharge of vapor even when generated between fins 112.

The structure enhances the heat absorption performance, as described above. In addition, in the present embodiment vapor outlet 110 has a cross-sectionally annular shape that includes a circumference provided with the end portions of fins 112 and an opening thereof is provided proximate to an upper surface of fins 112.

The operation status in the present embodiment is explained with reference to FIG. 22B. A process is the same as described above, in which a working fluid having a low temperature flows in from working fluid inlet 109 and vaporizes on heat-receiving surface 103a having fins 112. It is also the same that an extra working fluid is discharged from vapor outlet 110 in a gas-liquid two-layer flow.

In the present embodiment, however, the opening of vapor outlet 110 is provided slightly away from the upper ends of fins 112, or portions proximate to ends thereof, and thus the extra working fluid needs to be refluxed to the end portions of fins 112 once when the fluid is discharged. The fluid level of the working fluid is thus substantially constantly elevated at the end portions of fins 112, as shown in the drawing. Along with a fluctuation of the fluid level associated with vaporization through fins 112, the fluid level is moved vigorously throughout fine 112 as shown with arrows in both directions in the drawing.

The fluid level motion accelerates replacement of the working fluid on the heat-receiving surface 103a, including fins 112. Thereby, a heat transfer rate and heat diffusion to the working fluid increase, and the working fluid vaporizes in a larger amount, eventually enhancing the heat absorption performance.

When the temperature of heat-receiving surface 103a sharply rises close to a dryout point due to a sharp increase in thermal load, and the working fluid in a central portion vaporizes explosively, the working fluid proximate to heat-receiving surface 103a is blown away, and thus transition to a dryout status is accelerated. The present invention, however, has an effect in which the working fluid existing in a surrounding area is transferred to the center of high temperature heat-receiving surface 103a, and thereby a risk of transition to dryout can be minimized.

As described above, when a large amount of the working fluid is transferred to the high temperature portion so as to increase a vaporization amount while preventing dryout, a condensation amount at the heat dissipater increases accordingly and the working fluid flows in accordance with the increase in the thermal load.

In other words, resistance increases to a drastic change of the thermal load. Further, since the opening of vapor outlet 110 is provided on a torus in the present embodiment, the above-described vaporization state is surly and evenly reproduced through the respective fins.

In addition, providing vapor outlet 110 annularly around working fluid inlet 109 swiftly discharges vapor bubbles formed on heat-receiving surface 103a and prevents a rapid transition to dryout, thus enhancing the heat absorption property.

Tenth Embodiment

A tenth embodiment of the preset invention, in which heat receiver 3 is vertically provided and operated, is explained below. For explanation purposes, identical reference numerals are provided to components identical to those in the sixth embodiment, and specific explanations thereof in the sixth embodiment are referred to.

In the embodiments explained above, the heat receiver has heat-receiving surface 103a perpendicular to a direction of gravity. It is generally up to users, however, whether a motherboard is installed vertically in parallel with the gravity direction, or horizontally perpendicular to the gravity direction in a PC case.

When PCs are used as servers, a plurality of PCs are generally stacked horizontally. Generally used stand-alone PCs are installed vertically in many cases, however, since a required PC installation area is small. In the latter case, heat-receiving surface 103a of MPU 101 directly mounted on a motherboard surface is provided in parallel with the gravity direction, and thus heat-receiving surface 103a in a heatsink apparatus of general PCs is provided in parallel with the gravity direction.

Figure 23:
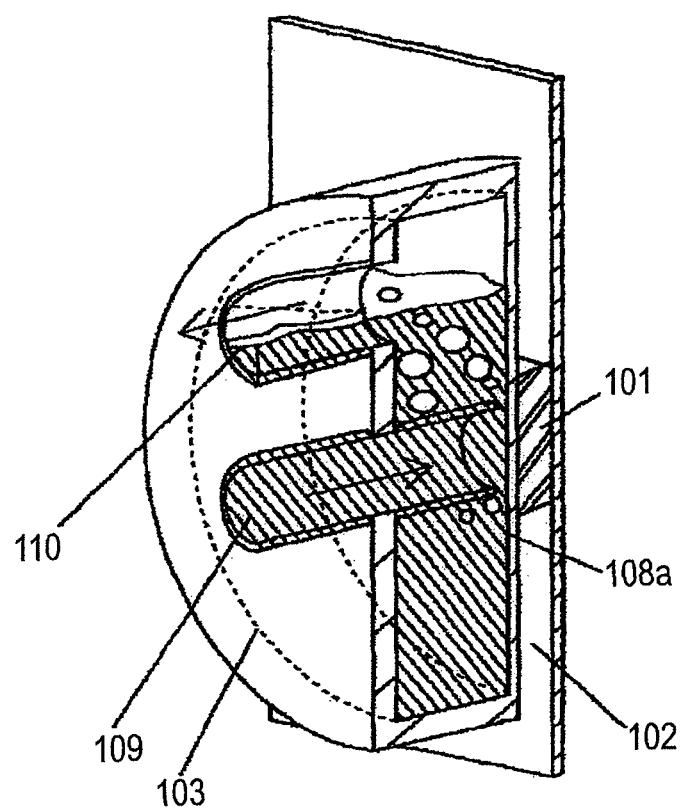
FIG. 23 is a cross-sectional perspective view illustrating a state where a heat receiver according to a tenth embodiment of the present invention is vertically provided and operated.

A state in which heat receiver 103 of the heatsink apparatus explained in FIG. 17 is vertically provided and operated, is explained below with reference to FIGS. 23 to 25. FIG. 23 is a cross-sectional perspective view illustrating a state where the heat receiver according to the tenth embodiment of the present invention is vertically provided and operated. In order to explain an internal portion, FIG. 23 provides a perspective view in which heat receiver 103 is cut along a surface parallel to the gravity direction and passing the center of MPU 101 and heat-receiving surface 103a and is viewed from obliquely above.

Similar to FIG. 17, the gravity direction is downward in FIG. 23. FIG. 23 shows a state in which vapor outlet 110 is provided above working fluid inlet 109. In FIG. 23, a low temperature working fluid flows in from working fluid inlet 109, which has an opening on heat-receiving surface 103a immediately proximate to MPU 101. The working fluid is in a heat transfer state close to the state explained in FIG. 17.

Thus, as soon as elevated vapor bubbles gather in an upper portion of heat receiver 103, the bubbles are discharged from vapor outlet 110 along with an extra working fluid in a gas-liquid two-layer flow. Thereby, a heatsink apparatus can be provided even when heat receiver 103 of the heatsink apparatus is provided vertically.

Figure 24A:
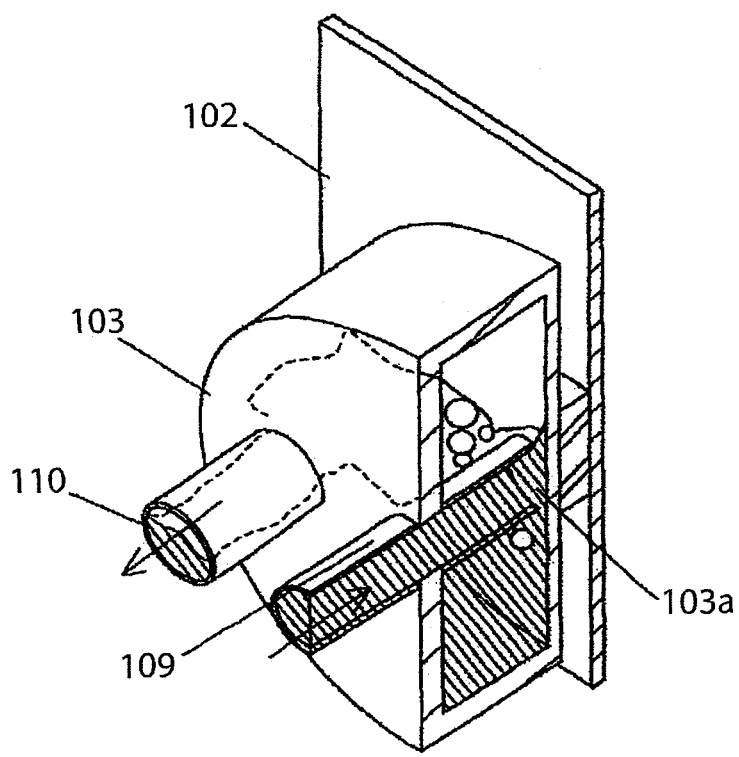
FIG. 24A is a cross-sectional perspective view illustrating an operation status of the heat receiver of a heatsink apparatus according to the tenth embodiment of the present invention.
Figure 24B:
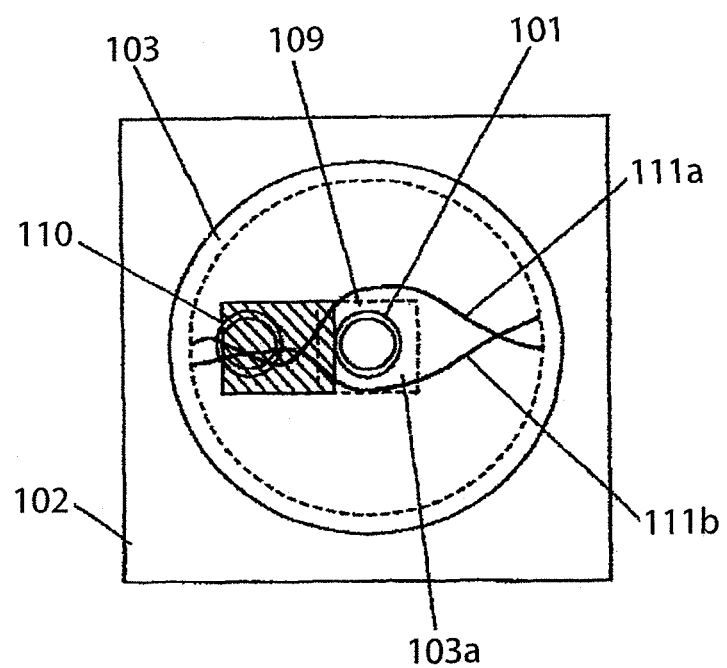
FIG. 24B is a conceptual diagram illustrating a state of a fluid level of a working fluid inside the heat receiver according to the tenth embodiment of the present invention.

A case where vapor outlet 110 is provided in parallel with working fluid inlet 109 is explained with reference to FIGS. 24A and 24B. FIG. 24A is a cross-sectional perspective view illustrating an operation status of the heat receiver of the heatsink apparatus according to the tenth embodiment of the present invention; and FIG. 24B is a conceptual diagram illustrating a state of a fluid level of a working fluid inside the heat receiver according to the tenth embodiment of the present invention. FIG. 24A also provides a perspective view in which heat receiver 103 is cut along a surface parallel to the gravity direction and passing the center of MPU 101 and heat-receiving surface 103a and is viewed from obliquely above. Vapor outlet 110 is provided above working fluid inlet 109 in FIG. 23, but, in FIG. 24A, an opening of vapor outlet 110 is provided at a height so as to include an area to which a contact surface of MPU 101 is moved horizontally.

As described above, the volume of the working fluid significantly changes before and after vaporization. Since the working fluid moves accordingly, the fluid level ruffles significantly, as shown in FIG. 24B. In FIG. 24B, heat receiver 103 of the present embodiment is viewed from a direction in which an opening surface of working fluid inlet 109 is in parallel with a drawing surface. As described above, the opening of vapor outlet 110 is provided with the height so as to include the area to which the contact surface of MPU 101, which is shown with a shaded area in the drawing, is moved horizontally.

In the structure above, heat-receiving surface 103a proximate to MPU 101 having a high heat density is submerged below fluid level 111a of the working fluid at a certain point. Conversely, heat-receiving surface 103a proximate to MPU 101 is exposed above fluid level 111b at another point.

The two states of fluid level 111a and fluid level 111b substantially alternate, and thus heat-receiving surface 103a does not continue to be above the fluid level for a long time. When heat-receiving surface 103a is submerged below the fluid level, the heat transfer mode of heat-receiving surface 103a is nucleate boiling or convection heating, as shown in FIG. 15. When heat-receiving surface 103a is exposed above the fluid level of fluid level 111b, heat-receiving surface 103a increases its temperature, and eventually enters an overheated State since the working fluid exceeds a boiling point. However, the state immediately changes to the fluid level 111a state.

In other words, a low temperature working fluid sequentially comes in contact with overheated heat-receiving surface 103a according to the change of the fluid level. In this state, the working fluid is in a high heat transfer state of vaporization mode, hovering around the boundary of transition boiling and nucleate boiling in FIG. 15. As a result, a good heat absorption property can be achieved in terms of a time average.

Figure 25:
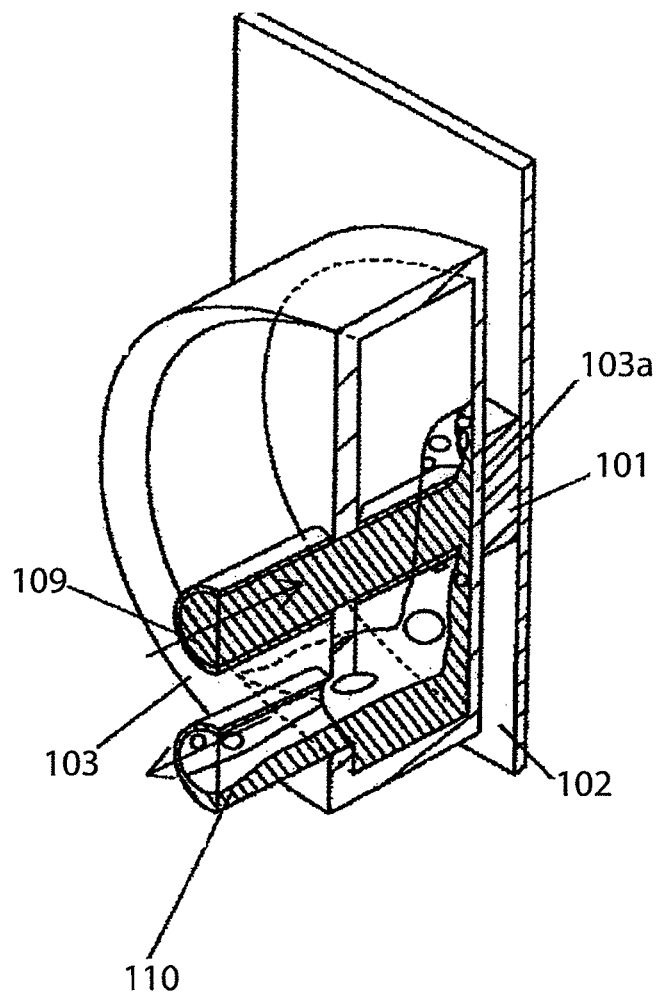
FIG. 25 is a cross-sectional perspective view illustrating an operation status of the heat receiver of the heatsink apparatus according to the tenth embodiment of the present invention.

In FIG. 25, vapor outlet 110 is provided so as to be open below working fluid inlet 109 or at a lowest portion in an internal space of heat receiver 103.

FIG. 25 is a cross-sectional perspective view illustrating an operation status of the heat receiver of the heatsink apparatus according to the tenth embodiment of the present invention.

Even with the structure, a process is basically the same in that a working fluid flowing in from working fluid inlet 109 vaporizes on heat-receiving surface 103a, and that generated vapor is discharged from vapor outlet 110 along with the working fluid in a gas-liquid two-layer flow.

Since the working fluid proximate to vapor outlet 110 is rapidly discharged by the vapor, a time average fluid level of the working fluid staying in heat receiver 103 is at a height around the center of the opening of vapor outlet 110. Thus, as shown in FIG. 25, the working fluid flowing in from working fluid inlet 109 passes through the opening and contacts with heat-receiving surface 103a. A portion of the working fluid vaporizes and turns into vapor, and the remaining working fluid flows down along heat-receiving surface 103a and then gathers at a bottom portion. Thereafter, similar to the case of FIG. 24A, the working fluid proximate to vapor outlet 110 is rapidly discharged by the vapor.

Accordingly, a fluid film on heat-receiving surface 103a remains thin and the low temperature working fluid is constantly supplied in the present embodiment. Similar to the seventh embodiment shown in FIGS. 20A and 20B, there is no process in which formed vapor bubbles move upward in the working fluid in heat receiver 103, and the bubbles are released into a space immediately above heat-receiving surface 103a through a water film proximate thereto.

Further, the water film shortens a temperature increase time per unit area. Vapor is thus generated in a larger amount, thereby enhancing the heat absorption performance.

In the present embodiment, when the installation direction of a PC case is determined and an amount of heat and heat density to be processed are great, shifting working fluid inlet 109 upward to some extent evens out a temperature distribution on heat-receiving surface 103a immediately proximate to MPU 101, thereby eliminating an overheated portion and preventing transition to film boiling. As a result, the heat absorption perforce is enhanced. Based on an experimental comparison with the embodiment in FIG. 23 and the embodiment in FIG. 24A, it is coded that a thermal resistance value in the embodiment of FIG. 25 is superior by 0.02° C./W (i.e., a surface temperature of MPU is lower by 2 degrees when a heat of 100 W is received).

Figure 26:
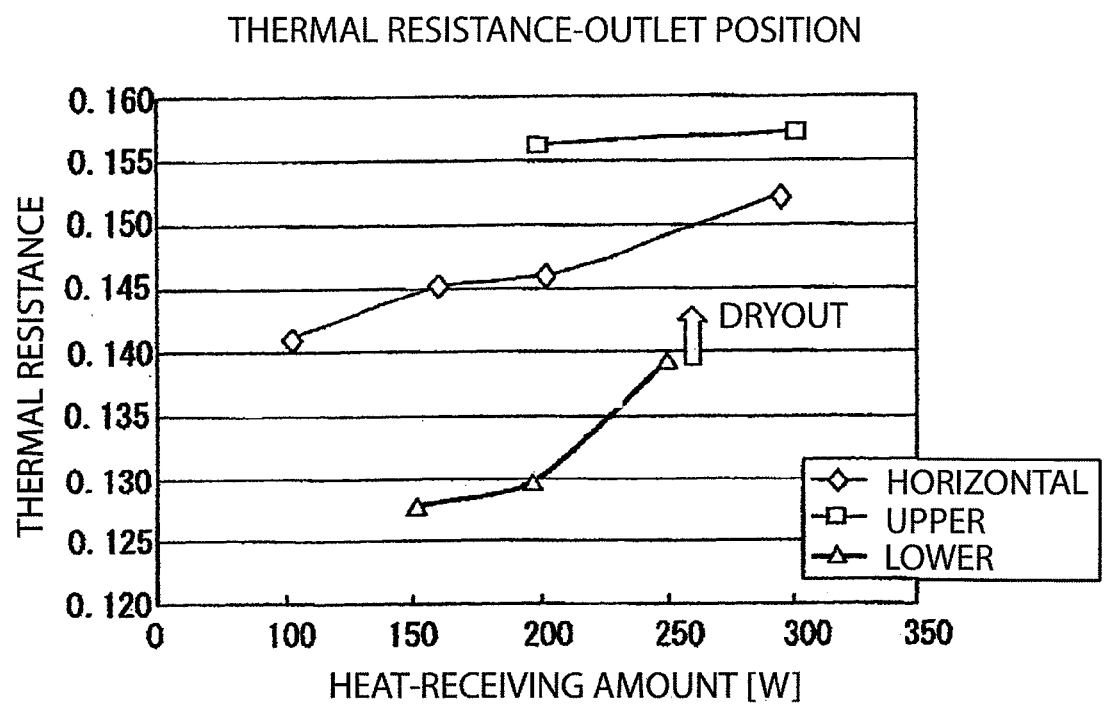
FIG. 26 illustrates a relation between a heat-receiving amount and thermal resistance at relative positions of a heat-receiving surface and a vapor outlet, obtained from an experiment.

FIG. 26 illustrates a relation between a heat-receiving amount and thermal resistance at relative positions of heat-receiving surface 103a and the vapor outlet, obtained from an experiment.[2] FIG. 26 shows results of the experiment, in which "horizontal" indicates the state of FIG. 24A (according to the description below and the drawing); "upper" indicates the state of FIG. 23; and "lower" indicates the state of FIG. 25 (according to the description below and the drawing). When the heat-receiving amount is 200 W, the performance is in an order of "lower," "horizontal," and "upper." In each of the states, the thermal resistance increases according to an increase in the heat-receiving amount. Different from the "horizontal" (FIG. 24A) state, in which the change is substantially linear, the performance sharply declines when the heat-receiving amount exceeds a certain point in the "lower" (FIG. 25) state. Accordingly, it is considered that, when a thermal load (a heat-receiving amount) sharply increases, a temperature does not sharply increase on heat-receiving surface 103a immediately in the case of FIG. 24A, since the working fluid is continuously supplied even in a small amount, while the fluid level of the working fluid staying in heat receiver 103 is on heat-receiving surface 103a immediately proximate to MPU 101 having a high heat density. It is considered, however, that, in the embodiment of FIG. 25, the boiling mode drastically changes to film boiling, thus causing dryout. Thus, the system of FIG. 24A is suitable in a case where there is an enough margin to an upper limit of temperature even though a drastic fluctuation of thermal load is expected. Meanwhile, the system of FIG. 25 is suitable in a case where a fluctuation of thermal load (heat-receiving amount) is moderate, but the thermal load is relatively high.

Accordingly, the three structures above can be used appropriately depending on purposes.

Eleventh Embodiment

Figure 27:
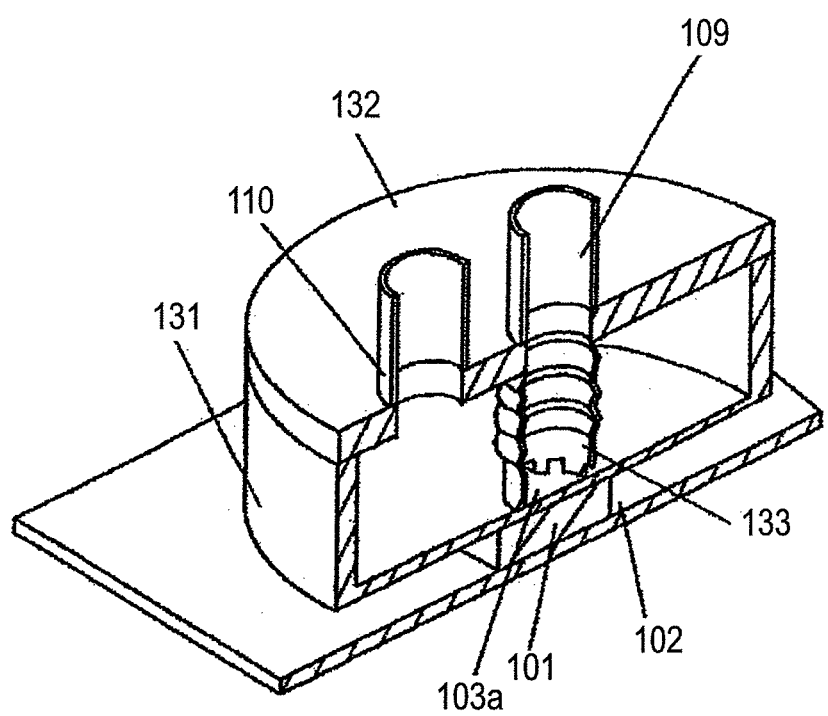
FIG. 27 is a cross-sectional perspective view illustrating an operation status of a heat receiver of a heatsink apparatus according to an eleventh embodiment of the present invention.
Figure 28:
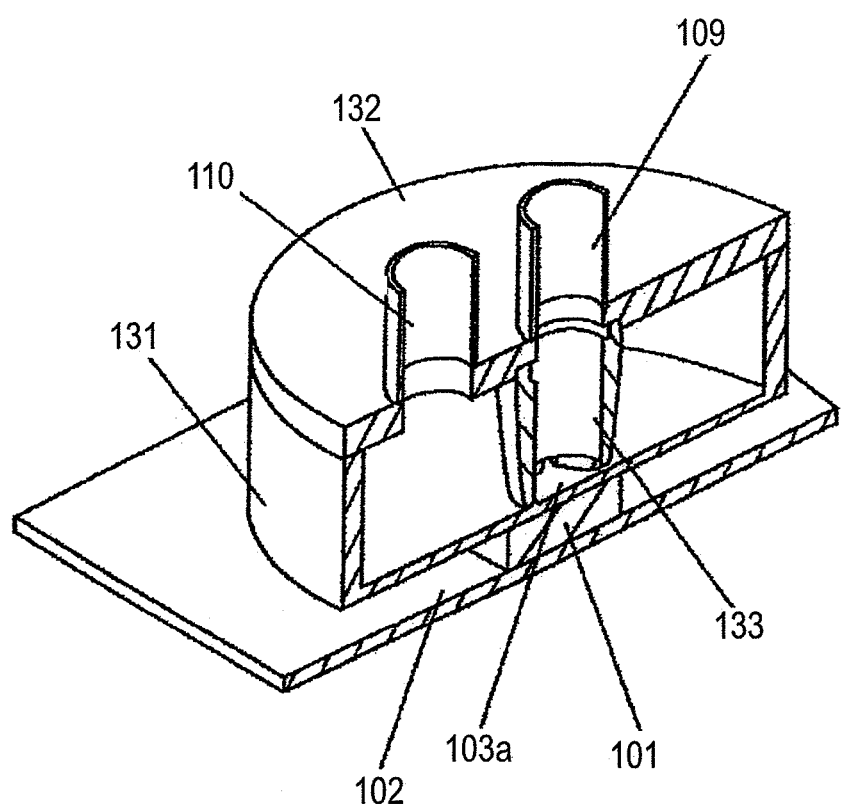
FIG. 28 is a cross-sectional perspective view illustrating an operation status of a heat receiver of a heatsink apparatus in an alternative example according to the eleventh embodiment of the present invention.
Figure 29A:
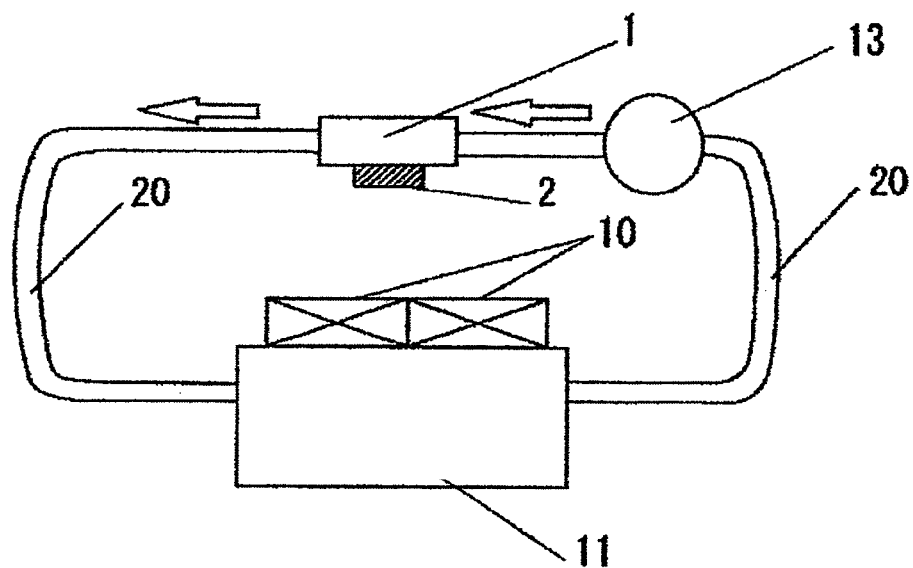
FIG. 29A illustrates a structure of a conventional heatsink apparatus.
Figure 29B:
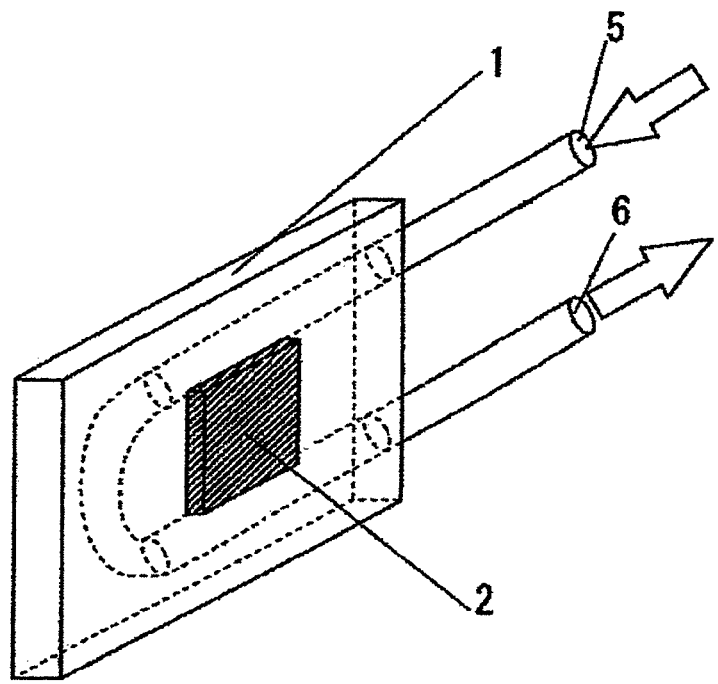
FIG. 29B illustrates a structure of a heat receiver of the conventional heatsink apparatus.
Figure 30:
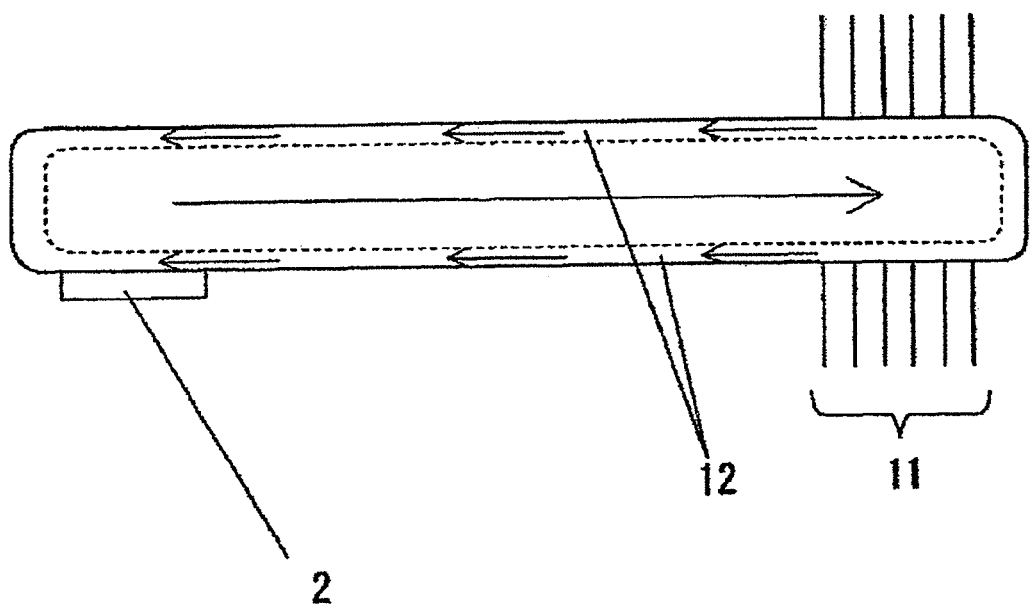
FIG. 30 illustrates a structure of an alternative conventional heatsink apparatus using a heat pipe.

A structure of working fluid inlet 109 is explained below with reference to FIGS. 27 and 28. FIG. 27 is a cross-sectional perspective view illustrating an operation status of a heat receiver of a heatsink apparatus according to an eleventh embodiment of the present invention; and FIG. 28 is a cross-sectional perspective view illustrating an operation status of a heat receiver of a heatsink apparatus in an alternative example according to the eleventh embodiment of the present invention. For explanation purposes, identical reference numerals are provided to components identical to those in the sixth embodiment, and specific explanations thereof in the sixth embodiment are referred to.

To simplify manufacturing of a heat receiver, which is generally formed of copper and the like, at least two split pieces are cast or forged to produce the heat receiver.

FIG. 27, heat receiver lower portion 131 includes heat-receiving surface 103a, and heat receiver upper portion 132 is integrally provided with working fluid inlet 109 and vapor outlet 110. As described above, heat receiver lower portion 131 and heat receiver upper portion 132 are produced separately. Then, the components are integrated in methods including air-tight fastening with an O ring in between, soldering, welding, and bonding, so as to be formed a part of a heatsink apparatus.

Heat receiver lower portion 131 and heat receiver upper portion 132 inevitably have a certain geometric tolerance in production. It is preferable that the tolerance be large in order to increase a yield. Unless an adjustment mechanism is provided, it is thus difficult to achieve a distance from the opening of working fluid inlet 109 or vapor outlet 110 and heat-receiving surface 103a, the distance being optimized at about 0.2 mm as described above.

In the present embodiment, therefore, working fluid inlet 109 has a short shape not extending proximate to heat receiver 103, and an opening portion of working fluid inlet 109 is provided as opening member 133, which is a separate body. Opening member 133 includes an opening on a heat-receiving surface 103a side, the opening being provided with cut-out portions point-symmetric with respect to the opening center and substantially axis symmetric with respect to a normal line passing through a face center of heat-receiving surface 103a on which the working fluid flows as described above. Opening member 133 also has perpendicular flexibility at least to heat-receiving surface 103a. Opening member 133 is combined with working fluid inlet 109 by press-fitting, soldering, bonding, or welding end portions.

Usable materials include copper, anti-corrosion metal described above, and plastic that does not generate a non-condensed gas because of the reasons described above.

A thin plate cylinder, as shown in FIG. 27, is provided with a bellows shape in a middle portion and cut-out portions having a depth corresponding to the opening position on an end surface, so as to substantially evenly discharge the working fluid to a surrounding area. Thereby, an effect is obtained in which working fluid outlet 109 is opened proximate to heat-receiving surface 103a, as described above, and concurrently the above-described geometric tolerance in production is incorporated, with no use of a special adjustment mechanism or an adjustment process.

Thereby, the embodiment of the present invention can be practically applied in a simplified structure and process. Thus, the apparatus can be provided at a low cost and a variation among apparatuses can be narrowed.

It is preferable that rigidity of the flexible material for opening member 133 not be higher than necessary, and that the material be pressed against heat-receiving surface 103a with an appropriate pressure. When the pressing pressure is excessive, heat-receiving surface 103a deforms and a contact area with MPU 101 is not sufficient, thereby preventing heat transfer from MPU 101 and lowering the heat absorption performance.

FIG. 28 is an example in which the effect similar to FIG. 27 is achieved in an alternate structure. In the present embodiment of FIG. 28, heat receiver lower portion 131, which is forged, is provided with a projection on heat-receiving surface 103a, the projection having a height corresponding to the opening position. Manufacturing control of the projection height is relatively easy in forging, and thus a geometric tolerance is maintained sufficiently small.

Opening member 133 is formed of plastic having a certain level of flexibility and not generating the above-described non-condensed gas. Opening member 133 is press-fitted or screwed into a groove provided on heat receiver upper portion 132. When heat receiver upper portion 132 is fixed onto heat receiver lower portion 131, an end portion of opening member 133 on the heat-receiving surface 103a side contacts the projection on heat-receiving surface 103a and forms an appropriate gap.

According to the method, the similar effect can be obtained using more affordably produced plastic components than the example in FIG. 27. The embodiment was explained in FIGS. 27 and 28 regarding working fluid inlet 109 alone. However, the explanations are applicable to vapor outlet 110.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. A heatsink apparatus performing cooling by circulating a working fluid and causing a phase change between a liquid phase and a gas phase, the heatsink apparatus comprising:
   a heat receiver transferring heat to an internal wall configured to correspond to a surface of an external wall that is provided with a heat generating body;
   an inlet pipe supplying the working fluid into an interior space of the heat receiver, wherein the inlet pipe extends inwardly beyond an internal surface of the heat receiver that partially defines the interior space;
   an outlet pipe discharging vapor, generated by vaporizing, by heat from the internal wall, the working fluid supplied into the heat receiver;
   a heat dissipater provided at a location higher than the heat receiver and dissipating heat of the vapor passing through the outlet pipe to liquefy the vapor into the working fluid; and
   a check valve provided to the inlet pipe causing the working fluid that is liquefied by the heat dissipater to return to the heat receiver through the check valve, and the check valve causing the working fluid to circulate in a direction without using a pump based on a pressure increase that occurs on an outlet side of the check valve; wherein
   slits are provided in the internal wall, on a surface surrounded by an external circumference of an opening of the inlet pipe, and wherein
   the slits are provided radially in a direction from a central axis of the inlet pipe opening.

2. The heatsink apparatus according to claim 1, wherein the external circumference of the inlet pipe opening is provided symmetrically with respect to the internal wall and configured such that a center of a heat source of the heat generating body is positionable within the external circumference of the inlet pipe opening with respect to a plan view.

3. The heatsink apparatus according to claim 1, wherein the inlet pipe opening contacts the internal wall.

4. The heatsink apparatus according to claim 1, wherein the slits are provided at a central portion of the internal wall surrounded by the external circumference of the inlet pipe opening.

5. The heatsink apparatus according to claim 1, wherein a width of the slits is wider at a location farther from the center of the inlet pipe opening.

6. The heatsink apparatus according to claim 1, wherein a ratio of thickness h with respect to thickness H (h/H) is from 0.1 to 0.3, the thickness h being a thickness from a bottom portion of the slits to the surface of the external wall, the thickness H being a thickness from the internal wall provided with no slits to the surface of the external wall.

7. The heatsink apparatus according to claim 1, wherein a gap between the inlet pipe opening and the internal wall is 0.2 mm or less.

8. The heatsink apparatus according to claim 1, wherein a groove is provided intersecting the slits and the inlet pipe opening is inserted into the groove.

9. The heatsink apparatus according to claim 1, wherein the check valve regulates the working fluid to flow in one direction from the heat dissipater to the heat receiver.

10. The heatsink apparatus according to claim 9, wherein the check valve is provided on an opening side of the inlet pipe.

11. A heatsink apparatus performing cooling by circulating a working fluid and causing a phase change between a liquid phase and a gas phase, the heatsink apparatus comprising:
   a heat receiver transferring heat to an internal wall configured to correspond to a surface of an external wall that is provided with the heat generating body;
   an inlet pipe supplying the working fluid to an interior space of the heat receiver, wherein the inlet pipe extends inwardly beyond an internal surface of the heat receiver that partially defines the interior space;
   an outlet pipe discharging vapor, generated by vaporizing, by heat from the internal wall, the supplied working fluid in the heat receiver;
   a heat dissipater provided at a location higher than the heat receiver and dissipating heat of the vapor passing through the outlet pipe to liquefy the vapor into the working fluid; and
   a check valve provided to the inlet pipe causing the working fluid that is liquefied by the heat dissipater to return to the heat receiver through the check valve, and the check valve causing the working fluid to circulate in a direction without using a pump based on a pressure increase that occurs on an outlet side of the check valve; wherein
   a thickness of the internal wall is thinner than a thickness of a surrounding internal wall, the internal wall being provided inside an external circumference of an opening of the outlet pipe and configured to correspond to a portion of the external wall on which the heat-generating body is provided, and wherein
   slits are provided in the internal wall on a surface surrounded by an external circumference of an opening of the inlet pipe, and wherein
   the slits are provided radially in a direction from a central axis of the inlet pipe opening.

12. An electronic device including the heat generating body and comprising the heatsink apparatus according to claim 1.

13. An electronic device including the heat generating body and comprising the heatsink apparatus according to claim 2.

14. An electronic device including the heat generating body and comprising the heatsink apparatus according to claim 3.

15. An electronic device including the heat generating body and comprising the heatsink apparatus according to claim 11.

16. A heatsink apparatus performing cooling by circulating a working fluid and causing a phase change between a liquid phase and a gas phase, the heatsink apparatus comprising:
   a heat receiver transferring heat to an internal wall configured to correspond to a surface of an external wall that is provided with a heat generating body;
   an inlet pipe supplying the working fluid into an interior space of the heat receiver, wherein the inlet pipe extends inwardly beyond an internal surface of the heat receiver that partially defines the interior space;
   an outlet pipe discharging vapor, generated by vaporizing, by heat from the internal wall, the working fluid supplied into the heat receiver;
   a heat dissipater provided at a location higher than the heat receiver and dissipating heat of the vapor passing through the outlet pipe to liquefy the vapor into the working fluid; and
   a check valve provided to the inlet pipe causing the working fluid that is liquefied by the heat dissipater to return to the heat receiver through the check valve, and the check valve causing the working fluid to circulate in a direction without using a pump based on a pressure increase that occurs on an outlet side of the check valve, and wherein
   slits are provided in the internal wall on a surface surrounded by an external circumference of an opening of the inlet pipe, and wherein
   the slits are provided radially in a direction from a central axis of the inlet pipe opening.

* * * * *